(12) United States Patent
Choo et al.

(10) Patent No.: US 6,407,360 B1
(45) Date of Patent: Jun. 18, 2002

(54) LASER CUTTING APPARATUS AND METHOD

(75) Inventors: Dae-ho Choo, Suwon; Byeong-ill Kim, Seoul; Sung-uk Jung, Seoul; Woo-shik Lee, Seoul; Bum-soo Kim, Suwon, all of (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/231,091

(22) Filed: Jan. 14, 1999

(30) Foreign Application Priority Data

| Aug. 26, 1998 | (KR) | 98-34606 |
| Oct. 28, 1998 | (KR) | 98-45429 |
| Dec. 4, 1998 | (KR) | 98-53538 |
| Dec. 4, 1998 | (KR) | 98-53539 |
| Dec. 4, 1998 | (KR) | 98-53541 |

(51) Int. Cl.$^7$ .................................................. B23K 26/38
(52) U.S. Cl. ........................ 219/121.67; 219/121.68
(58) Field of Search ............................. 219/121.67, 121.72, 219/121.68, 121.69; 225/1, 93.5, 96

(56) References Cited

U.S. PATENT DOCUMENTS

| 3,800,991 A | * | 4/1974 | Grove et al. ............... 225/93.5 |
| 3,932,726 A | * | 1/1976 | Verheyen et al. ........... 225/93.5 |
| 4,027,137 A | * | 5/1977 | Liedtke .................. 219/121.84 |
| 4,403,134 A | * | 9/1983 | Klingel |
| 4,942,284 A | * | 7/1990 | Etcheparre et al. .... 219/121.84 |
| 5,359,176 A | * | 10/1994 | Balliet, Jr. et al. ...... 219/121.84 |
| 5,609,284 A | * | 3/1997 | Kondratenko .......... 219/121.67 |
| 5,776,220 A | * | 7/1998 | Allaire et al. |
| 5,925,024 A | * | 7/1999 | Joffe |
| 6,211,488 B1 | * | 4/2001 | Hoekstra et al. ........ 219/121.72 |
| 6,252,197 B1 | * | 6/2001 | Hoekstra et al. ........ 219/121.72 |
| 6,259,058 B1 | * | 7/2001 | Hoekstra ................ 219/121.67 |

FOREIGN PATENT DOCUMENTS

| JP | 59-88333 | * | 5/1984 |
| JP | 9-38959 | * | 2/1997 |
| WO | 94/22778 | * | 10/1994 |

* cited by examiner

*Primary Examiner*—Geoffrey S. Evans
(74) *Attorney, Agent, or Firm*—McGuireWoods LLP

(57) ABSTRACT

A laser cutter for cutting an object being cut such as a two glasses-attached panel for LCD using a laser beam. The laser cutter includes a laser unit for irradiating a laser beam with a specific wavelength along a marked cutting line of the object, a pre-scriber for forming a pre-cut groove at starting edge of the marked cutting line, and a cooling unit for cooling the cutting line which said laser beam has been irradiated. The pre-scriber can be a rotating blade.

15 Claims, 22 Drawing Sheets

A-A'

B-B'

C-C'

LASER CUTTING APPARATUS AND METHOD

BACKGROUND OF THE INVENTION (a) Field of the Invention

The present invention generally relates to cutting of a substrate, and more particularly to apparatus and method for cutting a brittle object such as a glass substrate for use of an LCD panel using a laser.

(b) Description of the Related Art

Liquid crystal display (LCD) devices are a well known form of flat panel display. Especially, the smaller, lighter and less power consumptive characteristics make the LCD devices considered as one of the most contending display devices to replace the cathode ray tube (CRT).

LCD devices include two pieces of glass substrates, and a liquid crystal inserted between the two glass substrates. The liquid crystal acts as an optical shutter for an incident light by changing its alignment state by applying an electric field, and thereby an image is displayed on the LCD screen.

To enhance a productivity in manufacturing such LCD devices, methods for making a plurality of panels in a single process have been proposed. One method is using a glass substrate having a size corresponding to those of a plurality of unit panels, for example, 6 unit cells.

When a thin film transistor (TFT) LCD is manufactured using two substrates of the above-mentioned large 6 unit LCD panel size, a gate line, a data line, a thin film transistor, a pixel electrode, an alignment film and other components necessary for 6 unit TFT substrates are formed on the inner surface of one of substrates, while a color filter layer, a counter electrode, a black matrix and the like which are necessary for 6 unit color filter substrates are formed on the inner surface of the other.

The two glass substrates are produced as a unit panel after undergoing a process of attaching two glass substrates using a sealant, a cutting process, a liquid injecting process, an end seal process, and a process of attaching a polarizing film.

FIG. 1 is a plan view of a mother glass substrate 1 for cutting, where cutting keys 20 are formed on each corner of LCD unit cells 6, and scribe lines 4a, 4b are defined along the cutting keys 20.

During the cutting process, a preliminary cutting groove having a selected depth is formed along the scribe lines 4a, 4b on the mother glass substrate 1 using a diamond cutter. Then, an impact is added onto the glass substrate 1 so as to separate LCD unit cells 6 from the mother glass substrate 1.

However, a cutting apparatus such as the diamond requires an impact for a complete separation after the preliminary cutting groove is formed, which scatters small glass chips all around the cutting line. Therefore, an additional dust collection device is needed in order to prevent a failure caused by those fine glass chips.

Moreover, a plurality of rough edges as shown in FIGS. 2A and 2B, which are expanded views of portions E1, E2 of FIG. 1, are generated when the mother glass substrate 1 is cut by a diamond cutter. A high stress is concentrated on the rough edges, and a higher stress is concentrated on a portion 8 that is extremely rough. Therefore, when the unit panel 6 is separated by an impact which is added after the preliminary cutting groove is formed, the unit panel 6 is separated along the portion 8 where a high stress is concentrated on, not along the preliminary cutting groove (marked as a dotted line). This failure may cut out an active area.

Such a problem occurs frequently while manufacturing a tiled LCD panel for a large screen display.

FIG. 3 is a plan view of an LCD panel 20 where the four unit panels (A to D) are tiled, and FIG. 4 is an expanded view of the portion E4 shown in FIG. 3.

As shown in FIGS. 3 and 4, assume that the unit panels cut by the diamond cutter are bonded by an optical bond 22. When the two LCD unit glasses A and B having rough cut faces 24 and 25 are bonded, a seam line 22 becomes at least 2 mm wide, due to the prominence and depression margin of cut faces 24 and 25 of LCD unit glass A and B. Therefore, the black matrix at the bonding boundary of the glass A and B also becomes at least 2 mm wide to cover the seam line 22. The black matrix at the bonding boundary is much wider compared with that of the black matrix on the surfaces of the two LCD unit glasses A and B. As a result, the seam line 22 distinguishes itself on a screen of the tiled LCD panel 20 during operation and it appears that the image is divided by the seam line. To prevent this, a minimum seam line width that can be achieved is calculated beforehand. Then, the width between the pixels of the LCD panel is designed to be the same as the calculated minimum width of the seam line, so that the seam line may serve as a black matrix, which prevents the split appearance of screen.

That is, an overall resolution of the tiled LCD module is determined by the width of the seam line. Therefore, to enhance the overall resolution of the tiled LCD module, the width of the seam line 22 needs to be narrowed.

However, narrowing the seam line 22 is extremely difficult to achieve due to the margin of error when cutting the LCD unit glass by a diamond cutter. Therefore, a large tiled LCD module with a low resolution is used for an outdoor projects which do not require a high resolution, despite of its high cost.

When the glass substrate 1 is cut along the scribe line 4a, i.e., a first cutting line, and is cut along the scribe line 4b, i.e., a second cutting line, the failure as shown in FIGS. 2A and 2B may frequently occur in the cross point where the scribe lines 4a and 4b cross each other.

If the substrate is cut by laser, even a minute crack is not generated at the cut surface. This is more important when the cross point is a panel pad or an active area.

A conventional cutting apparatus using a laser beam has following problems.

Coolant sprayed for cooling down the highly heated glass hinders the laser beam's cutting force of the glass substrate by dispersing the beam's radiation.

If gas is employed as coolant, the cooling gas becomes hot while cooling down the glass substrate. Thus, molecule of the gas moves actively, and the cooling gas is diffused into the laser beam output from a focusing lens housing, thereby scattering the laser beam.

If liquid is employed as coolant, the laser beam is also scattered due to vapors generated when the cooling liquid cools down the glass substrate.

If the laser beam is so-scattered, the heated area of the glass substrate becomes wider while the heating temperature becomes low. Thus, the crack may not be generated or may not propagate to inner surface of the glass substrate, which prevents complete cutting of the LCD unit cell from the glass substrate.

Another problem is that the LCD unit cell may be spotted and the liquid crystal injection opening of the LCD unit cell may be blocked when the coolant dries up.

Moreover, the coolant sprayed from the cooling unit is splashed, which causes an impediment of the laser cutting apparatus and scattering of the laser beam.

The aforementioned laser cutting process of the glass substrate is performed in a dark chamber, and the laser beam at an infrared ray band having approximately a wavelength of 1300 mm. Therefore, a worker cannot see whether the cutting laser beam is proceeding straight along the scribe line.

The crack moves along the direction in which the laser beam proceeds. Therefore, if the cutting laser beam goes out of the scribe line and turns to the inside of the LCD unit cell, the crack is also propagated toward the inside of the LCD unit cell. Thus, if the scanning line of the laser beam cannot be seen by the worker, all the LCD unit cells cut from the glass substrate may fail.

Any failure in the process of cutting one piece of glass substrate may in sequence cause another failure in the process of cutting a number of glass substrates in the subsequent process, which may result failures in a large number of LCD unit cells.

This is because a worker cannot individually confirm the cutting state of the glass substrate coming out of the chamber after finishing the laser cutting step.

Another problem is that, even though a worker recognizes any failure in cutting, a quite long period of time is required for an alignment between the scribe line formed on the glass substrate and the cutting laser beam, which lowers a productivity.

SUMMARY OF THE INVENTION

It is therefore an object of the present invention to prevent a cut failure occurring, end, and the cross point of cutting lines, when cutting a glass substrate and a panel.

It is another object of the present invention not to generate glass chips while of cutting a glass substrate and a panel.

It is still another object of the present invention to obtain a smooth cut face of a glass substrate and a panel.

It is further another object of the present invention to prevent a coolant from scattering a laser beam.

It is yet another object of the present invention to prevent the surface of an LCD unit cell or a liquid injecting opening from contaminated or blocked by a coolant.

It is yet another object of the present invention to prevent an impediment of a laser cutter caused by a coolant sprayed for the purpose of cooling down the laser scanned portion.

It is yet another object of the present invention to prevent sequential failures in LCD unit cells by checking a path of the laser beam for cutting a glass substrate so that a worker can easily confirm whether the cutting laser beam deviates from a scribe line.

It is yet another object of the present invention to enhance productivity by correcting the laser beam path when it deviates from the scribed line and aligning the laser beam with the scribe line.

It is yet another object of the present invention to provide a tiled LCD module having a high resolution by minimizing the width of a seam line formed at a boundary surface between the tiled LCD panels.

To accomplish the above objects, according to one aspect of the present invention, a laser cutter includes a laser unit for irradiating a laser beam with a specific wavelength along a cutting line marked on an object being cut; and a cooling unit for cooling the cutting line which said laser beam has been irradiated.

The laser cutter further includes a pre-scriber for forming a pre-cut groove at a selected portion, for example, the start edge, end edge or crossing point of the marked cutting lines before the laser beam is irradiated along the marked cutting line.

According to another aspect of the present invention, a laser cutter further includes a coolant inhaler for inhaling coolant sprayed toward the object being cut from a cooling unit. The cooling unit includes a coolant supplying part and a spraying nozzle. The coolant inhaler is disposed at the back of the cooling unit such that the sprayed coolant is effectively inhaled. The coolant inhaler includes an inhaling pipe disposed at the back of the cooling unit with respect to the traveling direction of the laser unit and a pump to vacuum the inhaling pipe.

According to still another aspect of the present invention, a laser cutter includes a light modulator that perceives traveling paths of a first laser beam by modulating a part of the first laser beam into a second laser beam having another wavelength and transmits the remainder of the first laser beam.

The light modulator comprises a beam splitter for splitting an incident laser beam of a laser unit into two laser beams by transmitting a part of the incident laser beam and reflecting the remainder of the incident laser beam, a light modulation part for modulating the laser beam reflected from the beam splitter into a visible ray thereby to generate an indicative laser beam, and a reflective mirror for reflecting the modulated indicative laser beam at a selected angle.

The cutting laser beam transmitted and the indicative laser beam reflected are both irradiated on the marked cutting line such that the indicative laser beam is positioned behind the cutting laser beam with respect to the traveling path of the two beams.

According to further another aspect, a laser cutter includes a first laser unit for irradiating a first laser beam with a first wavelength along a cutting line marked on an object being cut, a cooling unit for cooling the marked cutting line irradiated by the first laser beam to generate cracks at the cooled cutting line, a second laser unit for irradiating a second laser beam with a second wavelength onto the crack of the object being cut, a light detecting part for detecting the second laser beam reflected by the crack; and a control unit for outputting a signal for correcting a path of the first laser beam by comparing a real cutting path obtained by the light detecting part with the marked cutting line to determine whether the real cutting path deviates from said marked cutting line.

Here, the first and second laser units respectively includes a laser oscillating unit for oscillating a laser beam, a refraction lens disposed in front of the laser oscillating unit to refract the laser beam at a selected direction, a focusing lens group for focusing the refracted laser beam on the marked cutting line and a focusing lens housing containing the focusing lens group.

In addition, the light detecting part is a light detecting sensor for detecting light amount of the second laser unit reflected by the crack.

Preferably, in the above-mentioned laser cutters, the cooling unit includes a spray nozzle for spraying coolant, in which the spraying nozzle has an oblique tip. Since the diameter of the laser beam is smaller than that of the spraying nozzle, the most acute portion of the tip of the spray nozzle is aligned with the marked cutting line such that the crack does not deviate from the marked cutting line.

According to yet another aspect, there is provided a method for cutting a brittle object using a laser cutter. The method first detects a cutting line marked on the object and the beginning point of the cutting line. Afterwards, a pre-cut groove of a selected length and depth is formed at the starting edge of the marked cutting line. A laser beam is then irradiated along the marked cutting line, starting from the pre-cut groove. Thereafter, the marked cutting line is rapidly cooled.

The cutting method according to the present invention can be applied to an object having at least two cutting lines normal to each other or arranged at a selected angle. At the cross point of the cutting lines, the pre-cut groove may be formed before the irradiation of the laser beam or when the cross point appears. Here, the pre-cut groove has a selected length along the cutting lines, or may have a circular structure.

Also, the object can be cut by two steps through controlling the cutting depth of the object in each step. The two step cutting substantially prevents the cutting failure due to an irregular crack generated at the rear surface of the object.

According to yet another aspect of the invention, there is provided a method for cutting a brittle object using a laser cutter. The method first irradiates a laser beam along a marked cutting line. Afterwards, the marked cutting line is rapidly cooled. Thereafter, a real cutting line is perceived by crack generated during the cooling step. Next, it is determined whether the real cutting line deviates from the marked cutting line by comparing the real cutting line with the marked cutting line. If a deviation exists in, the traveling path of the laser beam is corrected.

Here, the real cutting line is perceived by irradiating the laser for the alignment and then detecting light amount reflected by the crack, and the marked cutting line is inputted beforehand.

The above-mentioned laser cutter and cutting method are especially good for the fabrication of a tiled LCD panel.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those having skill in the art.

Figure 5:
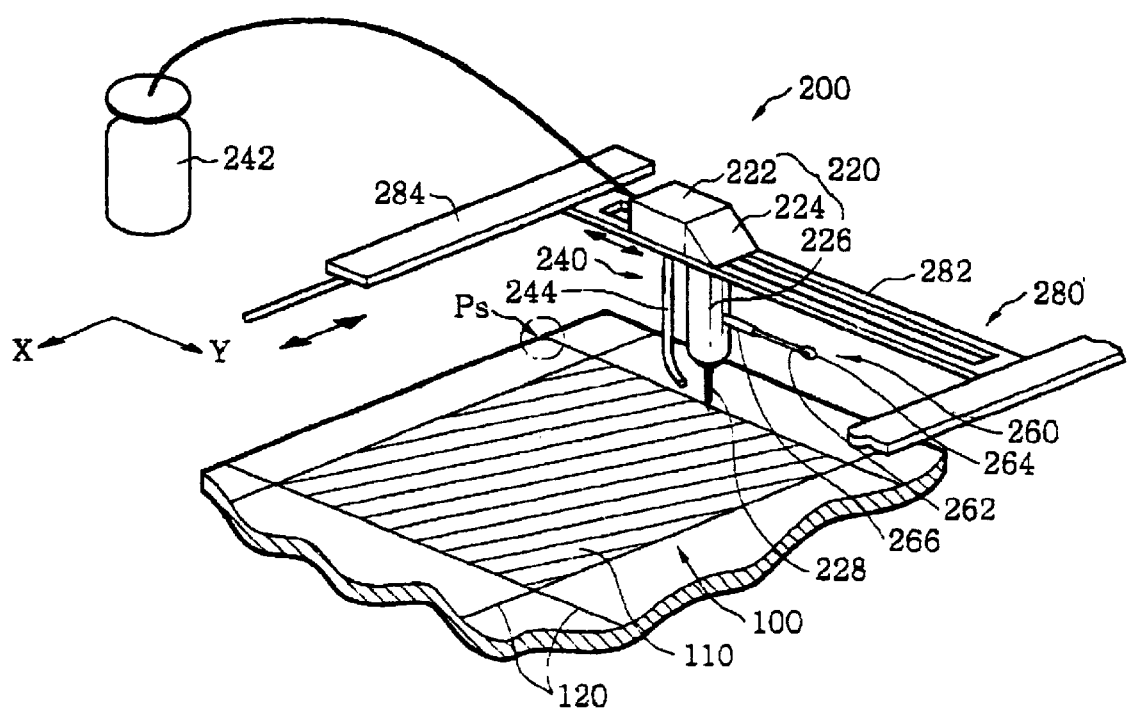
FIG. 5 is a perspective view of a laser cutter in accordance with an embodiment of the present invention.

FIG. 5 is a perspective view of a cutting apparatus 200 using laser beam (hereinafter referred to "laser cutter"), in which a pre-scriber 260 for forming pre-cutting groove at start edge and end edge of a marked cutting line to a selected depth is disposed in front of a laser unit 220.

In FIG. 5, an object being cut, is, for example, two sheets of mother glasses, each of which has a size corresponding to at least one unit cell area, for example six unit cells area. For instance, the object is a liquid crystal display panel attached to each other with a space there between before liquid crystal is injected into the space. One sheet of the panel is a thin film transistor substrate and the other sheet is a color filter substrate. In FIG. 5, reference numeral 120 is a cutting line or scribe line.

Although not shown in FIG. 5, the thin film transistor substrate includes a plurality of thin film transistors, gate and data bus lines respectively connected to gate and source electrodes of the thin film transistors, and a plurality of pixel electrodes connected to drain electrode of the thin film transistors. The color filter substrate includes a counter electrode and color filters of red(R), green(G), and blue(B) formed on the inner surface thereof.

The laser cutter 200 in accordance with the first embodiment of the present invention includes a laser unit 220 irradiating a laser beam of a specific wavelength into the cutting line 120 of the attached substrates 100 and a cooling unit for rapidly cooling the cutting line on which the laser beam has been irradiated.

The pre-scriber 260 is disposed in front of the laser unit 220. The pre-scriber 260 forms pre-cut grooves at the start edge, end edge, or cross point of a marked cutting line to selected depth.

The laser unit 220, cooling unit 240, and pre-scriber 260 are respectively coupled to a moving unit 280, which moves along X-axis or Y-axis.

Figure 1:
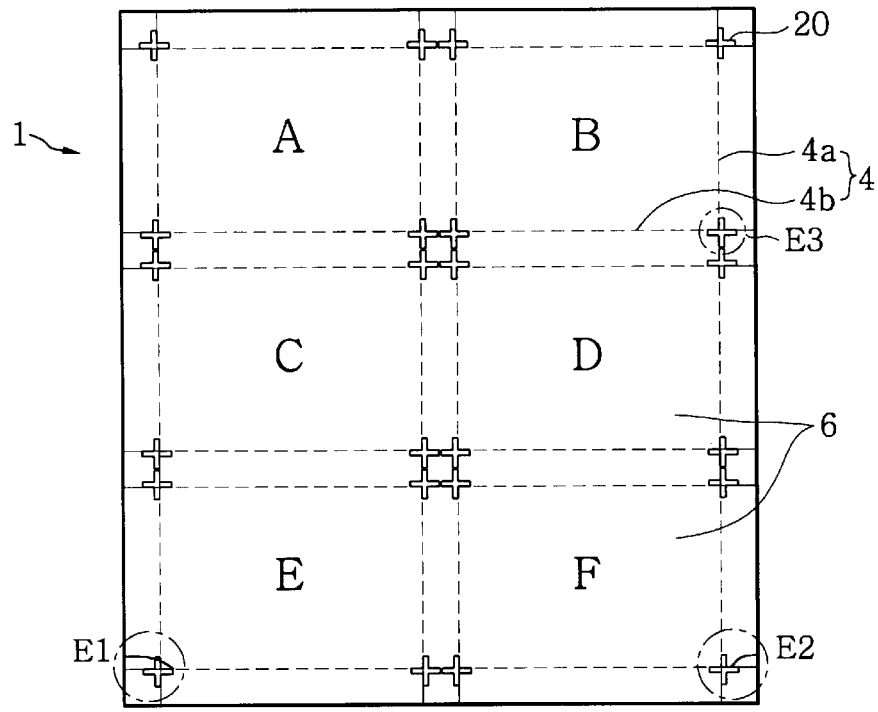
FIG. 1 is a plan view of a mother glass in accordance with the conventional art.
Figure 2A:
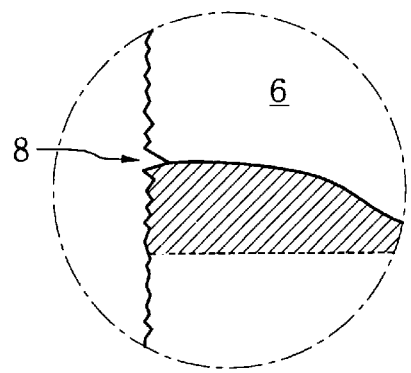
FIGS. 2A and 2B are expanded views of portions E1 and E2 in FIG. 1.
Figure 2B:
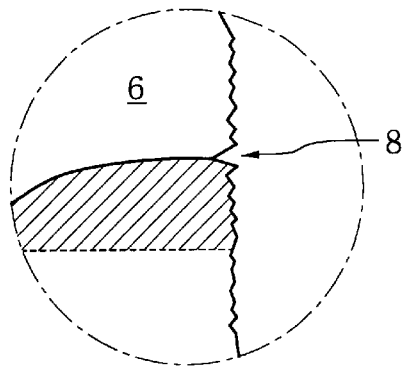
Figure 3:
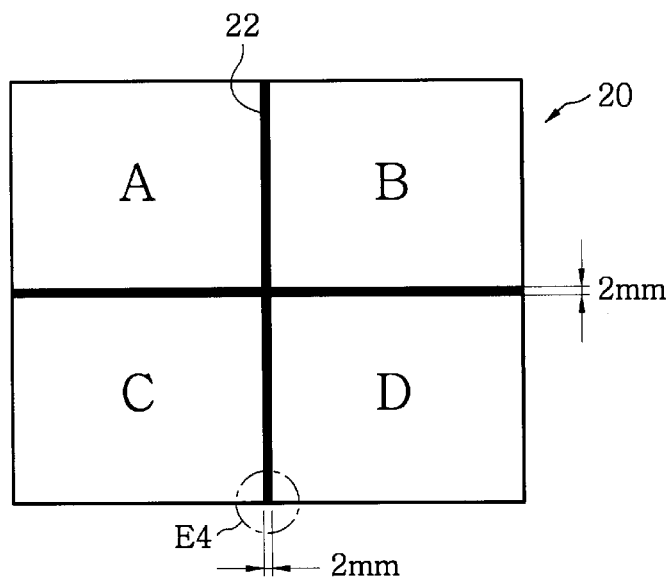
FIG. 3 is a plan view of a tiled liquid crystal display in accordance with the conventional art.
Figure 4:
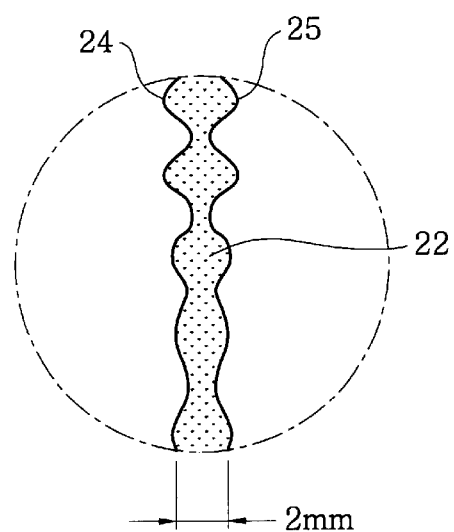
FIG. 4 is a detail view of the portion E4 in FIG. 3.

The cutting line 120 of the attached glass substrates 100 is defined as a connection line connecting at least two cutting keys 20 wherein the cutting keys 20 are marked on the outer surfaces of the substrates 100, as shown in FIG. 1.

The substrates 100 is separated not by one cutting process but by two cutting processes. That is, one side of the attached substrates 100 is cut first, and the other side is then cut. In addition, the cutting process progresses from the outer surface of each glass substrate towards the inner surface.

As a laser unit 220, YAG laser, $CO_2$ laser, diode laser and so on, can be used, each of which has an oscillation wavelength($\lambda$) of 10.6 $\mu$m and high outputs of 50–250 watts. At this time, when the glass substrate is cut, the laser unit 220 outputs energy that increases the substrate temperature to the glass transition temperature Tg, which the cutting line as irradiated is phase-transformed from the solid to the liquid.

Figure 7:
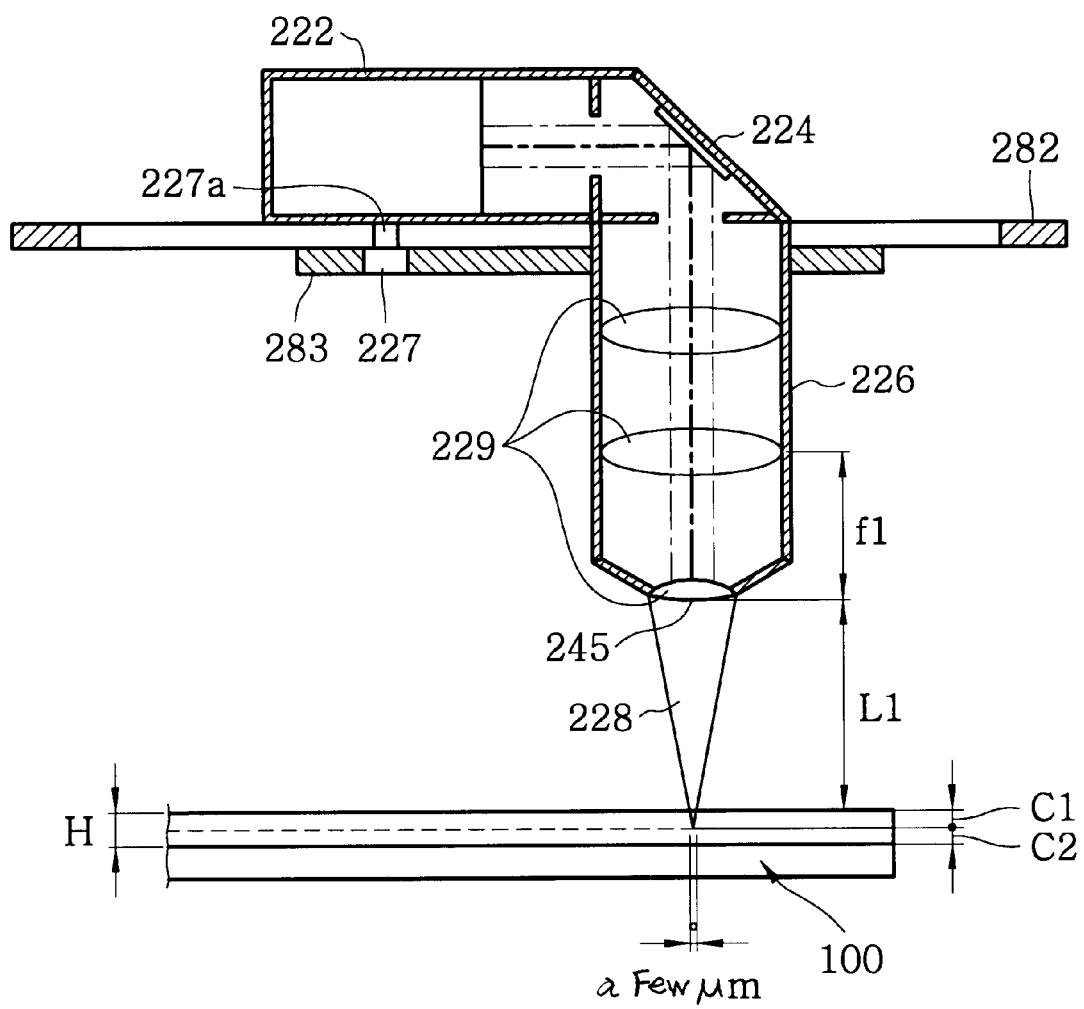
FIG. 7 is a sectional view of the laser cutter of FIG. 5.

As shown in FIG. 7, the laser unit 220 includes a laser oscillating unit 222, a refraction lens 224 for refracting laser beam oscillated from the laser oscillating unit 222, a focusing lens group 229 for focusing the laser beam to control the intensity of the laser beam, and a focusing lens group housing 226 for controlling the depth of focus by moving upwards and downwards.

Figure 6:
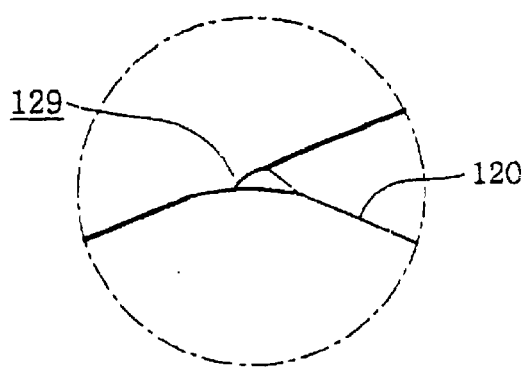
FIG. 6 is an expanded view of the portion Ps in FIG. 5.

Again, referring to FIG. 6, the cooling unit 240 located behind the laser unit 220 includes a coolant storing part 242 storing a coolant, and a spray nozzle 244 spraying the coolant along the cutting line 120 of the attached glass substrates 100.

The coolant is one selected from a group consisting of pure water, cooling oil, liquid nitrogen, and liquid helium, and is discretely sprayed with an interval of 0.1–0.3 seconds from the spray nozzle 244 onto the attached glass substrates 100.

The prescriber 260 that forms a pre-cut groove, being coupled in front of the laser unit 220, includes a body 266 staying parallel to the substrates 100 during non-operation and moving perpendicularly to the substrates 100 during operation, a rotating axis 262 coupled to the body 266, and a rotating blade 264 coupled to the rotating axis 262, rotating at a given RPM(round per minute) when the rotating axis 262 moves perpendicular to the substrates 100.

Here, the rotating axis 262 of the pre-scriber 260 operates according to a sensing signal from a position sensor 290 that detects a cutting start edge and cutting end edge of the cutting line. The position sensor 290 is located in front of the laser unit 226 as shown in FIGS. 8A to 8C.

The laser unit 220, cooling unit 240, pre-scriber 260, and position sensor 290 are all disposed in the moving unit 280, which moves to the X-axis or Y-axis direction.

More specifically, the laser unit 220, cooling unit 240, pre-scriber 260, and position sensor 290 move along a groove-shaped rail formed in a Y-axis moving plate 282 in Y-axis direction, and the Y-axis moving plate 282 itself moves along a rail of a X-axis moving plate 284. That is, the Y-axis direction movement is performed by moving the laser unit 220, cooling unit 240, prescriber 260, and position sensor 290 simultaneously along the rail of the Y-axis plate 282, while the Y-axis plate 282 is locked. On the other hand, the X-axis direction movement is performed by moving the Y-axis moving plate 282 along the rail of the X-axis plate 284, so that the laser unit 220, cooling unit 240, pre-scriber 260, and position sensor 290 all coupled to the Y-axis moving plate 282 are moved.

Figure 8A:
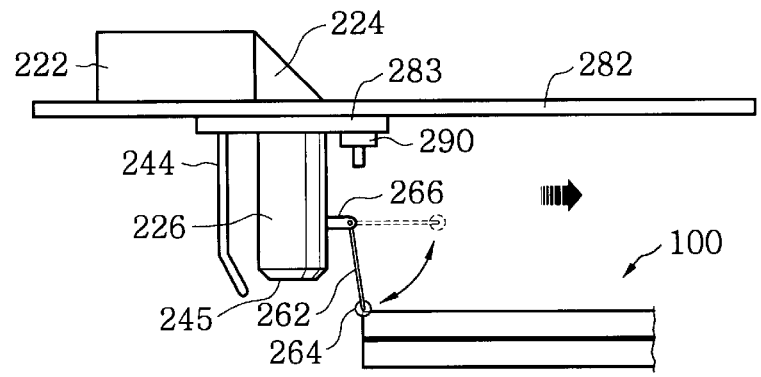
FIGS. 8A to 8C are schematic views showing a manner of cutting a mother glass with the laser cutter of FIG. 5.
Figure 8B:
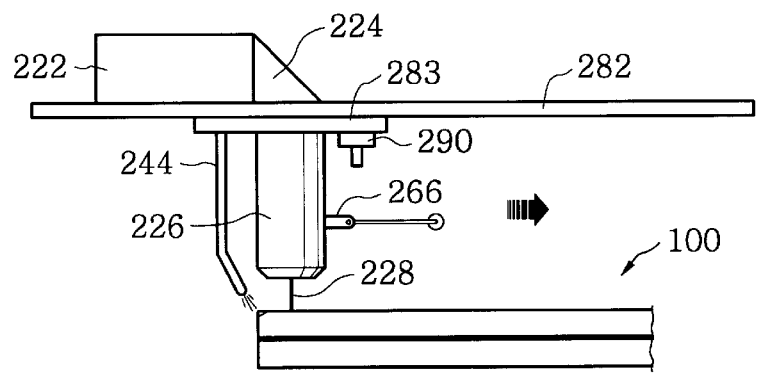
Figure 8C:
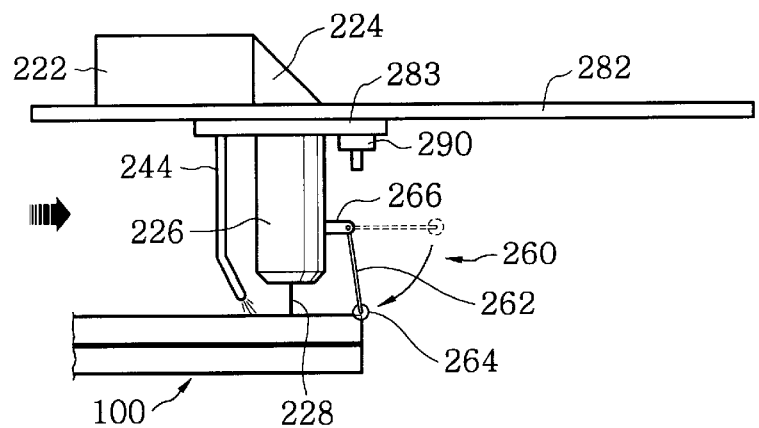

Referring to FIGS. 8A to 8C, there is disposed an auxiliary moving plate 283 below the Y-axis moving plate 282, to which the laser unit 220, cooling unit 240, pre-scriber 260, and position sensor 290 are coupled.

A method of cutting the LCD panel 100 of two glass substrates with the above mentioned laser cutter 200 is described with reference to FIGS. 5 to 9.

First, referring to FIGS. 5 and 8A, the two glass substrate 100 is mounted on a moving plate(not shown). The laser cutter 200 moves toward the substrate 100, and then the position sensor 290 disposed in front of the focusing lens group housing 226 detects the cutting start edge Ps.

Detecting the cutting line 120 and cutting start edge Ps, the rotating axis 262 of the pre-scriber 260 moves clockwise and the rotating blade 264 is positioned at the cutting start edge. The rotating blade 264 rotates at a certain RPM, to form a pre-cut groove (or pre-cut start groove) at the cutting start edge.

Next, referring to FIGS. 5 and 8B, after forming the pre-cut groove, the rotating blade 264 stops and the rotating axis 262 returns to the original position by moving counterclockwise.

Thereafter, the focusing lens housing 226 moves forward by an interval between the position sensor 290 and the focusing lens housing 226 to position the laser beam irradiating start point at the cutting start edge of the cutting line 120 of the substrate 100. Afterwards, the focusing lens housing 226 moves along the cutting line 120 irradiating the laser beam.

At this time, the cutting line 120 is heated to a high temperature by the irradiation of the laser beam, resulting in a local heat-expansion with a high stress concentration. The nozzle 242 of the cooling unit 240 following the focusing lens housing 226 sprays a coolant onto the heated cutting line 120 discretely by an interval of 0.1–0.3 seconds, so that the heated cutting line 120 is rapidly cooled. The coolant has a very low temperature compared with the heated cutting line 120.

By cooling the cutting line 120, the cutting line 120 is repeatedly heat-expanded and contracted and thereby high thermal stress is concentrated on the cutting line 120 of the substrate 100.

When the thermal stress exceeds bonding force of the glass molecules, amorphous glass molecule bonding is broken and thereby crack is generated along the cutting line 120.

The generated crack is propagated along the irradiating direction of the laser beam, that is, perpendicularly with respect to the surface of the substrate 100, so that the substrate 100 is completely cut.

Next, FIGS. 5 and 8C, while the focusing lens housing 226 progresses along the Y-axis moving plate 282 while irradiating the laser beam, the position sensor 292 detects the cutting end edge of the cutting line 120. As the cutting end edge is detected, the rotating axis 262 moves clockwise to form a pre-cut groove (or pre-cut end groove) at the end edge of the cutting line 120. The pre-cut end groove has the same structure as the cutting start groove.

After forming the pre-cut end groove, the rotating axis 262 returns to the original position by moving counterclockwise, and the focusing lens housing 226 stops after completing to irradiate the laser bean onto the end edge of the cutting line 120.

Next, the laser cutter 200 is aligned for cutting along the X-axis direction and cut in the same manner as cutting along the Y-axis.

Figure 9:
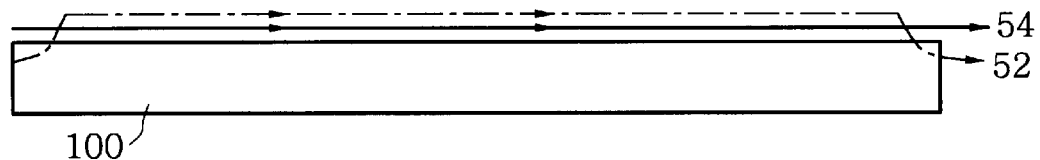
FIG. 9 is a view showing moving paths of the laser beam and the rotating blade of the laser cutter of FIG. 5.

FIG. 9 shows the moving paths of the focusing lens housing 226 and rotating blade 264 in the above mentioned laser cutter. Reference numeral 52 indicates the moving path of the rotating blade 264 and reference numeral 54 indicates the moving path of the focusing lens housing 226.

As shown in FIG. 9, the moving path 52 of the rotating blade 264 is positioned at the cutting start edge and cutting end edge within a specific depth, and is positioned over the surface of the substrate 100 throughout the remaining portions.

Cutting through one side of the two glass substrate through the above processes, the substrate is flipped over to cut the other side. The other side is cut by the same method.

Figure 10:
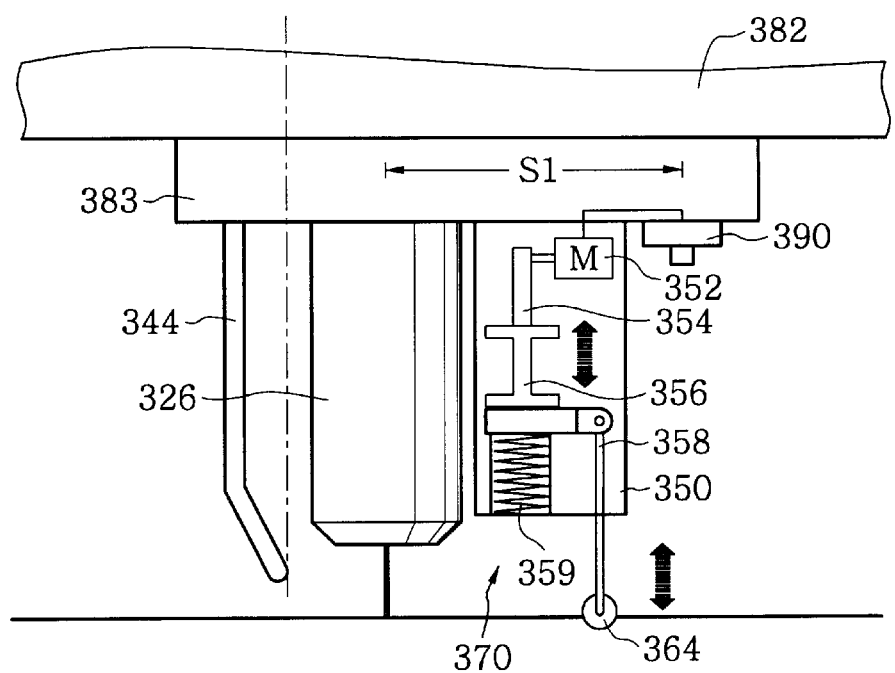
FIG. 10 is a view schematically showing the pre-scriber of the laser cutter of FIG. 5.

FIG. 10 shows another embodiment of the prescriber disclosed in the laser cutter of FIG. 5. In the present embodiment, the rotating blade moves up and down, which is different from the movement of the pre-scriber disclosed in FIG. 5. In FIG. 10, reference numeral 382 is a Y-axis moving plate and reference numeral 383 is an auxiliary moving plate.

Referring to FIG. 10, a prescriber 370 is independently disposed in front of the focusing lens housing 326.

The pre-scriber 370 includes a motor 352 rotating according to the sensing signal of a position sensor 390, an eccentric cam 354 eccentrically coupled to the rotating axis of the motor 352 rotating together as the motor 352 rotates, a push rod 356 moving up and down according to the rotation of the eccentric cam 354, a rotating blade rod 358 of moving up and down according to the up and down movement of the push rod 356, an elastic member for the rotating blade rod 358 pressed down by the push rod 356, a rotating blade 364 coupled to the one sided end of the rotating blade rod 358 rotating at a specific RPM, and a housing 350 containing the above mentioned elements.

As shown in FIG. 10, the rotating blade rod 358 can be divided into a first rod and a second rod, where the first rod is pressed by the push rod 356 and the second rod is fixed normal to one end of the first rod. On the other hand, the rotating blade rod can be formed as one body.

Figure 11A:
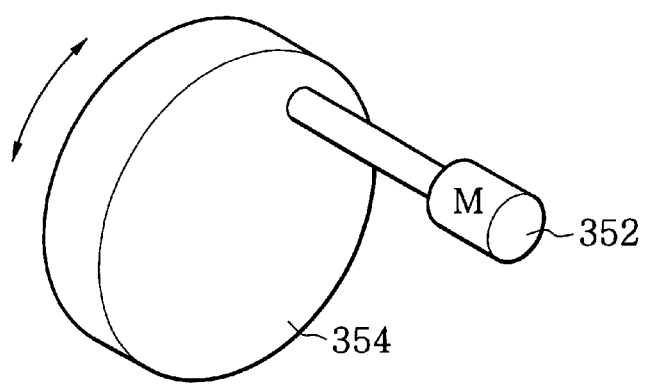
FIGS. 11A and 11B are perspective views of the eccentric cam in the pre-scriber of FIG. 10.
Figure 11B:
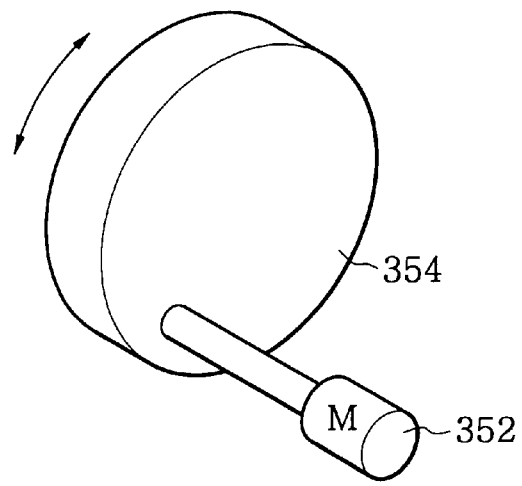

The eccentric cam 354 has an ellipse plate shape to press the upper end of the push rod 356 with an axis eccentric along the long axis of the ellipse plate, as shown in FIGS. 11A and 11B.

While the focusing lens housing 326 moves towards the edge of the substrate 100, as the position sensor 390 disposed in front of the laser unit 326 senses the cutting start edge of the cutting line, the motor 352 rotates to a certain angle. By the rotation of the motor 352, one sided end of the eccentric cam 354 which is more distant from the eccentric axis presses the push rod 356, and thereby the rotating blade rod 368 is moved downwards toward the cutting start edge of the cutting line. As the rotating blade 364 is in contact with the surface of the substrate, the rotating blade 364 rotates at a specific RPM to form a pre-cut groove at the cutting start edge of the cutting line.

After forming the pre-cut groove, as the motor 352 rotates, the eccentric cam 354 rotates such that one-sided end thereof near the eccentric axis presses the push rod 356 as shown in FIG. 11B. As the eccentric cam 354 rotates, the elastic member 359 pushes the rotating blade rod 368 upwards by repulsive force, separating the rotating blade 364 from the substrate 100.

When the focusing lens group housing 326 moves by a distance S1 between a sensing position of the cutting start edge detected by the position sensor 390 and the laser beam irradiating axis, the laser unit 326 starts to irradiates the laser beam.

Similarly to the above mentioned embodiment, a spray nozzle 344 disposed at the back of the moving plate 383 sprays coolant along the irradiating path of the laser beam.

As the moving position sensor 390 detects the cutting end edge of the cutting line, the motor 352 rotates again to position the eccentric cam 352 at the status of FIG. 11A, and the rotating blade 364 pushed downward toward the surface of the substrate 100 forms a pre-cut end groove.

When the focusing lens group housing 326 moves by a distance S1 between a sensing position of the cutting end edge detected by the position sensor 390 and the laser beam irradiating axis, the laser unit 326 stops to irradiate the laser beam. Simultaneously, the nozzle 344 stops to spray coolant.

As described previously, the laser cutter 200 disclosed in embodiment 1 substantially prevents that the actual cutting deviates from the marked cutting line by forming a pre-cut groove respectively at the start edge and at the end edge of the marked cutting line before the laser beam is irradiated onto the marked cutting line.

In addition, the laser cutter 200 substantially prevents unnecessary electric power and coolant by accurately controlling the timing for the laser beam irradiation and the coolant spray.

Meanwhile, although the present invention shows that the pre-cut groove is formed both at the cutting start edge and at the cutting end edge, it is possible to form a pre-cut groove either at the cutting start edge or at the cutting end edge. Moreover, although the present invention describes that the two glass substrate stays, while the laser unit cooling unit, and pre-scriber are moving, it is also possible that the laser unit, cooling unit and prescriber stay, while the substrate moves for the cutting process. In other words, the cutting can be performed by relative movements between the laser cutter and the substrate.

Meanwhile, according to the present cutting method, the substrate 100 is cut by the propagation of the crack generated in the cutting line of the substrate by rapidly heating and rapidly cooling the substrate. And, the substrate is cut through one step of laser beam irradiation and cooling, which may result in non-uniform cracks generated at the inner surface facing the outer surface where the crack propagation starts, causing a cutting failure.

So as to prevent this kind of cutting failure, an improved cutting method is described with reference to the accompanying drawings FIGS. 7 and 12.

Figure 12:
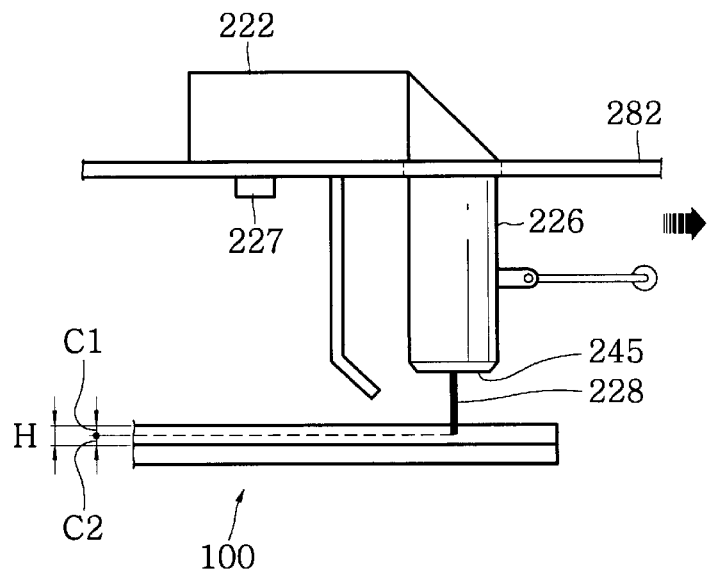
FIG. 12 is a schematic view showing a cutting manner in accordance with another embodiment of the present invention with the laser cutter of FIG. 5.

Referring to FIG. 12, the interval between the focusing lens housing 226 and the outer surface of the substrate 100 is adjusted for the glass substrate not to be cut completely. In other words, the depth of focus between the focusing lens group and the outer surface of the substrate 100, or the intensity of the laser beam is controlled such that about 60% of the overall thickness of the glass of the substrate 100 is cut first. Afterwards, the intensity of the laser beam is adjusted weaker than that of the first cutting step by controlling the interval between the focusing lens group housing 226 and the surface of the substrate 100 and cut the remaining 40% thickness of the glass of the substrate 100.

By applying the above-mentioned two-step cutting process, the non-uniform crack can be substantially prevented.

The above cutting method is more specifically described with reference to the accompanying drawings FIGS. 7 and 12.

As shown in FIGS. 7 and 12, the interval between the laser beam irradiating outlet 245 of the laser cutter 200 and the outer surface of the substrate 100 is controlled to be L1 and the depth of focus of $CO_2$ laser beam is controlled such that the diameter of the laser beam 228 ranges within a few $\mu$m. Next, a first cutting step is performed such that the overall thickness H of the glass of the substrate 100 is not completely cut but only C1 of the overall thickness H of the glass is cut first. Afterwards, the interval L1 between the laser beam irradiating outlet 245 and the outer surface of the substrate 100 is changed by moving the cylinder 227 and cylinder rod 227a, to adjust the focus of laser beam 228. Here, the diameter of the laser beam during the second cutting step reaches a few hundreds times than that of the laser beam during the first cutting step. Then, the intensity of the laser beam is adjusted to be weaker than that of the first cutting step by controlling the interval between the focusing lens group housing 226 and the surface of the substrate 100. During the second cutting step, the remaining thickness C2 of the glass of the substrate 100 is cut.

Here, the intensity of the laser beam during the second cutting step ranges between the melting temperature of the mother glass and the glass transition temperature. And, in order to reduce the total irradiation time, second laser beam can be irradiated by moving the laser unit in direction opposite to that of the first laser beam irradiation.

Meanwhile, faces cut by the diamond blade or the laser cutter are very sharp. Therefore, stress is concentrated on upper edge line of the cut faces, so that the edge line can be easily broken even with a weak external impact. Especially, when the diamond blade is used to cut the substrate, glass chips remaining on the surface of the cut face cause failures in attaching a polarizing film on the outer surface of the substrate or in attaching a tape carrier package to interconnection terminals formed on the glass of the substrate. In order to prevent these kinds of failures, it is required to grind the edge of the cut face in addition.

Grinding, however, generates static charges, causing a failure of electric elements, such as a thin film transistor. Accordingly, it is strongly required that a grinding method without generating static charges be developed.

Figure 13:
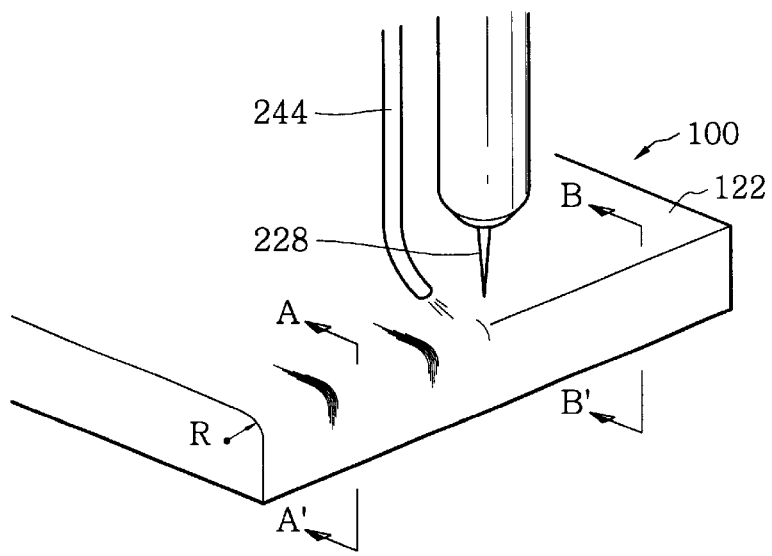
FIG. 13 a schematic view showing a processing manner of the cutting face in accordance with still another embodiment of the present invention.

FIG. 13 shows an improved grinding method without generating static charges during the grinding step of the cut face.

Referring to FIG. 13, along the upper edge of the cut face cut by the laser cutter 200 previously mentioned, the laser beam 228 is irradiated such that intensity thereof is over the melting point of the mother glass. When the upper edge of the cut face starts to melt by the irradiation of the laser beam, the following nozzle 244 of the cooling unit 240 sprays coolant along the melted upper edge of the cut face. As a result, the melted upper edge of the cut face becomes round.

Figure 14A:
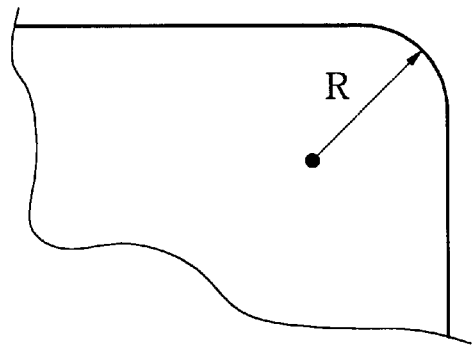
FIG. 14A is a sectional view taken along the line A–A' of FIG. 13.
Figure 14B:
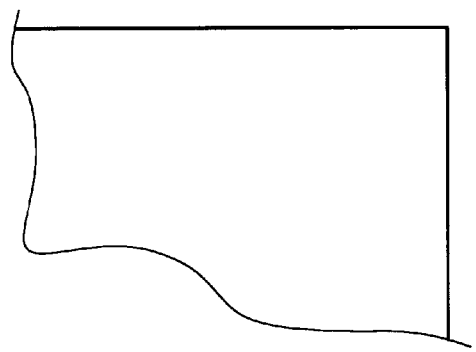
FIG. 14B is a sectional view taken along the line B–B' of FIG. 13.

FIG. 14A is a sectional view taken along the line A–A' of FIG. 13, in which the upper edge of the cut face is rounded such that it has a curvature radius R, and FIG. 14B is a sectional view taken along the line B–B' before the upper edge of the cut face is rounded.

Individual substrates separated according to the above mentioned method are assembled to make an LCD module through the subsequent LCD panel fabrication processes.

Meanwhile, when using a large-area substrate with an area of the sum of multiple unit panels, the intervals between the adjacent cutting lines plays an important role in determining the unit panel size. In other words, an increased interval between the adjacent cutting lines decreases, the unit panel size and a decreased interval increases the unit panel size.

Figure 15:
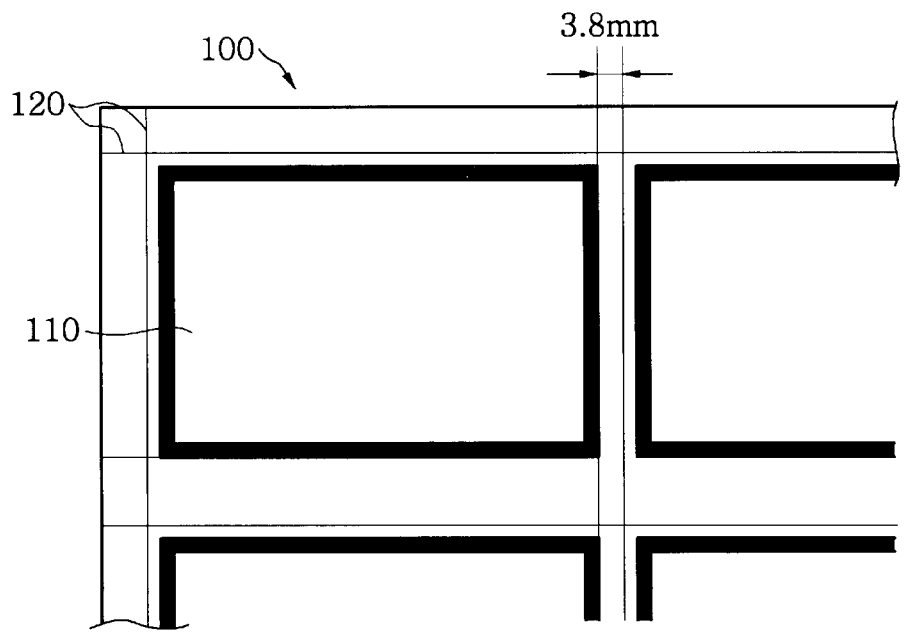
FIGS. 15 and 16 are schematic views showing a cutting manner in accordance with another embodiment of the present invention.

For example, as shown in FIG. 15, when an area of 550 mm×650 mm is separated to make four units of 15 inches unit panel 110, the interval between two adjacent cutting lines 120 is 3.8 mm. Therefore, it is possible that larger-than 15 inch unit panels can be made if the interval between the two adjacent cutting lines can be decreased.

Figure 16:
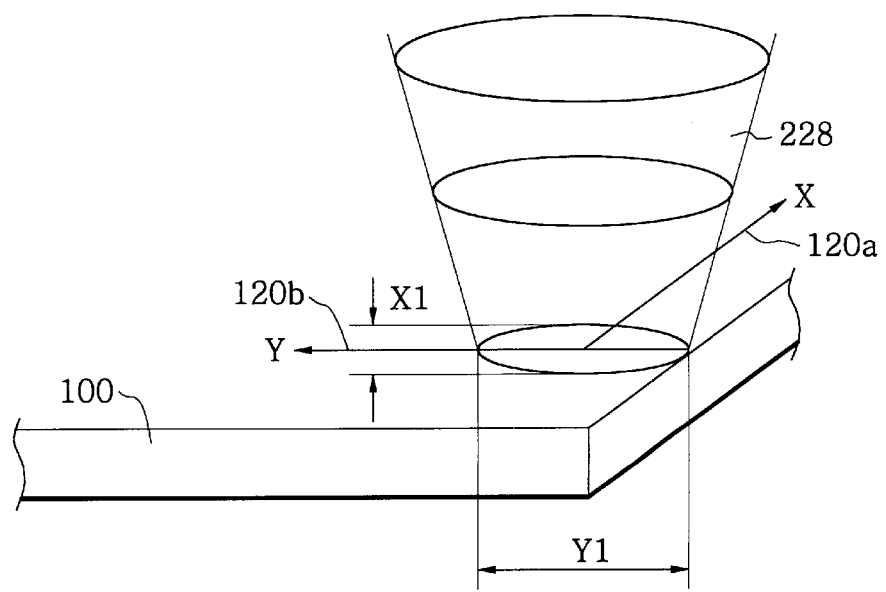

Accordingly, as shown in FIG. 16, the focusing laser beam 228 is made ellipse. In FIG. 16, the substrate is cut along the Y-axis. The focusing laser beam 228 has a longer axis Y1 parallel with the cutting line and a shorter axis X1 normal to the cutting line.

Meanwhile, when the cutting is made along the X-axis direction, the focusing laser beam 228 has a longer axis X1 parallel with the cutting direction and a shorter axis Y1 normal to the cutting line.

Table 1 shows measuring results of the cutting speed according to the variation of the longer axis diameter Y1 and the shorter axis diameter X1 of the focusing beam 228 when the cutting direction is Y-axis direction.

TABLE 1

|  | Diameter of focusing beam | | Cutting speed |
| --- | --- | --- | --- |
| Examples | X1 | Y1 | (mm/s) |
| Example 1 | 10 mm | 30 mm | 2 |
| Example 2 | 1 mm | 30 mm | 30 |
| Example 3 | 10 $\mu$m | 70 mm | 400 |

As shown in Table 1, when the shorter axis diameter X1 of the focusing beam is made relatively smaller, to much degree, than the longer axis diameter Y1, the focusing beam becomes a sharp slit structure, resulting in improvement of the cutting speed.

Thus, use of the elliptical focusing beam not only fastens the cutting speed but rounds the upper edge of the cut face where cracks start to propagate and leaves the lower edge where crack propagation ends sharp. Therefore, the present cutting method may eliminate an additional grinding step of rounding the upper edge of the cut face. Moreover, unlike a diamond blade cutting, since no glass chips are generated at the lower edge of the cut face when using the present method, the same effect as grinding can be obtained without an additional grinding step.

Preferably, ratio of the shorter axis diameter X to the longer axis diameter Y is set more than 1:50. The shorter axis ranges from 1 $\mu$m to 500 mm and the longer axis ranges from 10 mm to 100 mm.

As a result, the above described cutting method increases the size of the unit panel, improves the cutting speed, and enhances yields in the LCD panel manufacturing by eliminating glass chips and cracks on the cut face.

Meanwhile, when the cutting lines cross each other, it is difficult to perform a secondary cutting step using a laser beam if the substrate is first cut by a laser beam. The reason is that the cut face cut by the first laser cutting is very smooth. Therefore, when secondary cutting is performed using a laser beam along direction normal to the first cutting line, propagation of the crack stops prior to the crossing point of the first and secondary cutting lines.

Thus, in the present embodiment, so as to properly cut a substrate with a crossing point, a pre-cut groove is formed in the crossing point of the cutting lines.

Figure 17:
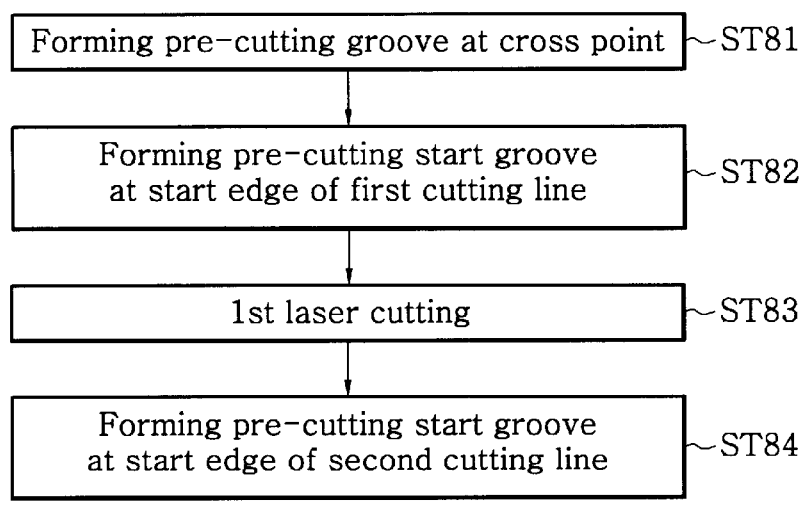
FIGS. 17 to 21 are schematic views showing a cutting manner in accordance with still another embodiment of the present invention.
Figure 18:
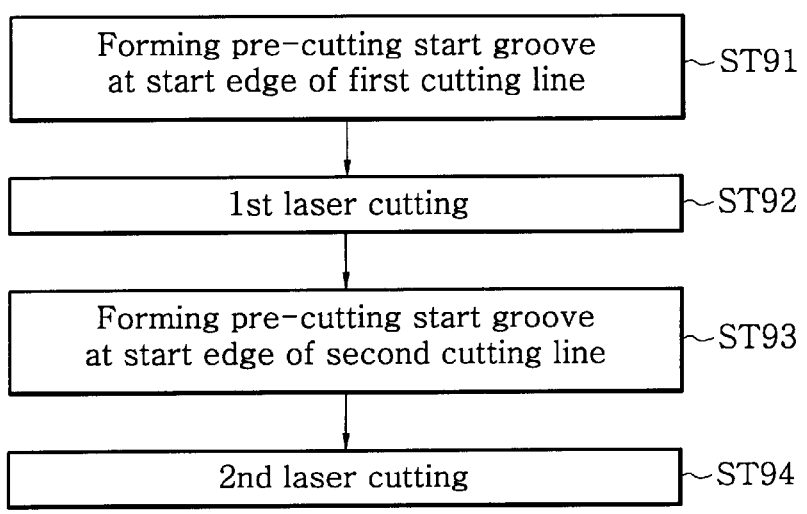

FIGS. 17 and 18 show methods for cutting an object having at least two cutting lines perpendicular to each other using a laser cutter with a pre-scriber to form a pre-cut groove.

Figure 19:
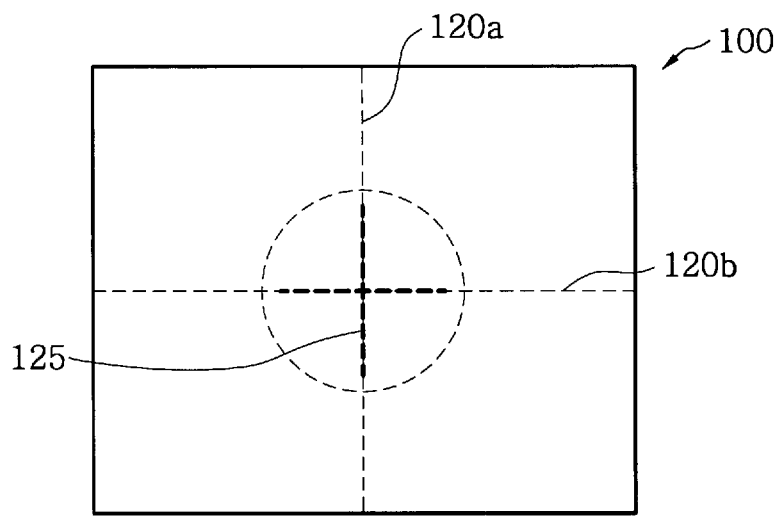
Figure 20:
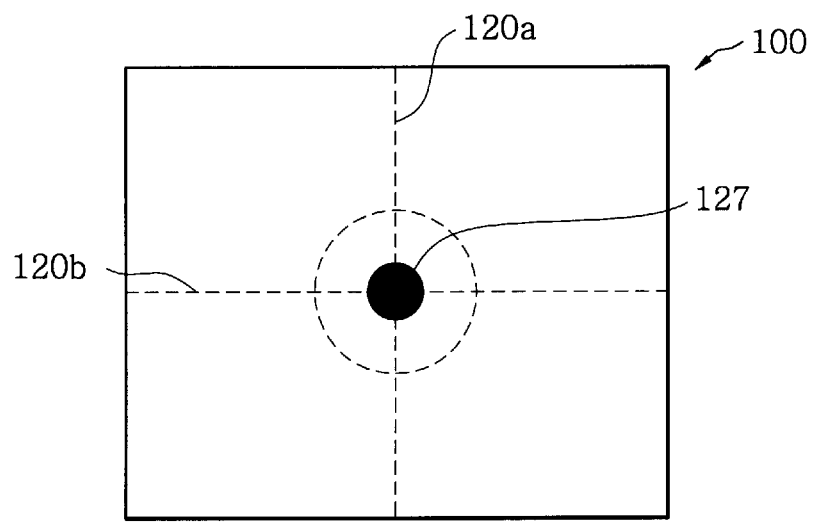

First, referring to FIGS. 17 and 19, a pre-cut groove 125 of a cross (+) shape is formed at the crossing point of two cutting lines 120a and 120b(ST81). Alternatively, the pre-cut groove formed at the crossing point can be made in circular shape as shown in FIG. 20. Next, a first pre-cutting start groove is formed at the start edge of a first cut line 120a(ST82). Afterwards, a laser beam is irradiated along the first cutting line 120a and simultaneously the laser beam-irradiated first cutting line 120a is rapidly cooled. During the irradiation of the laser beam, a first pre-cut end groove is selectively formed at the end edge of the first cutting line 120a. Here, the laser beam is irradiated till the end edge of the first cutting line 120a. Through the above steps, first cutting step is completed (ST83).

After the completion of the first cutting step, a second pre-cutting start groove is selectively formed at the start edge of a second cutting line 120b normal to the first cutting line 120a(ST84). Afterwards, laser beam is irradiated along the second cutting line 120b and simultaneously the laser beam-irradiated second cutting line 120b is rapidly cooled. During the irradiation of the laser beam, a cutting end groove is selectively formed at the end edge of the second cutting line 120b passing the cross point. Here, the laser beam is irradiated till the cutting end edge of the second cutting line 120b.

Through the above steps, second cutting step is completed.

In the first and second cutting steps, by the word "selectively" is meant that forming steps of the pre-cut grooves can be deleted.

According to the above method, while the crack is propagating along the second cutting line 120b, although the cross point appears, since pre-cutting groove has been formed at the cross point, the crack propagates with linearity passing the cross point till reaching the end edge of the second cutting line.

Figure 21:
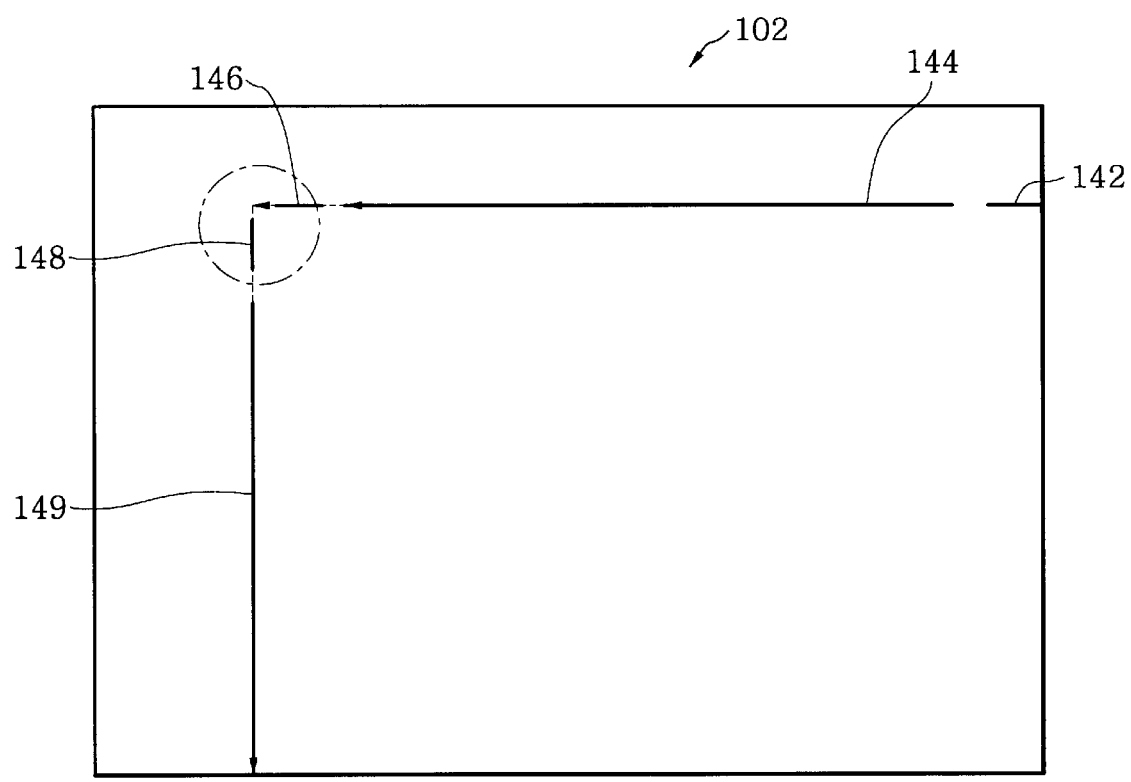

Meanwhile, it is required that another cutting method provided in FIG. 18 be applied to a case that a first cutting line 144 ends in a selected position of a mother glass as shown in FIG. 21.

Referring to FIGS. 18 and 21, a first pre-cut start groove 142 is first formed at the starting edge of a first cutting line 144 of a glass substrate 102 (ST91). Afterwards, a laser beam is irradiated along the first cutting line 144. The first cutting line 144 heated by irradiation of laser beam is then rapidly cooled down (ST92). Next, a first pre-cut end groove 146 is selectively formed at the end edge of the first cutting line 144. The irradiation of the laser beam along the first cutting line 144 and cooling down of the heated first cutting line 144 continue until reaching the end edge of the first cutting line 144 where the first pre-cutting end groove 146 has been formed. Through the above steps, first cutting step is completed.

After completing the first cutting process, the rotating blade of the pre-scriber for the formation of the pre-cut grooves is turned around by 90 degree such that it is aligned to a second cutting line 149 normal to the first cutting line 144. The rotating blade of pre-scriber forms a second pre-cut start groove 148 at the start edge of the second cutting line 149(ST93). Afterwards, laser beam is irradiated along the second cutting line 149. The second cutting line 149 heated by irradiation of laser beam is then rapidly cooled down. Next, a cutting end groove 146 is selectively formed at the cutting end edge of the second cutting line 149(ST94). The irradiation of the laser beam along the second cutting line 149 and cooling down of the heated second cutting line 149 continue until reaching the end edge of the second cutting line 149.

Through the above steps, second cutting process is completed. As described previously, by the word "selectively" is meant that forming steps of the cutting end grooves on the first and second cutting lines can be skipped.

According to the above method, since the pre-cut groove is formed at the start edge of the second cutting line 149 before the laser beam is irradiated along the second cutting line 149, a crack propagates with linearity to the end edge of the second cutting line 149.

Here, the pre-cut start and end grooves formed respectively at the first and second cutting lines as described in FIGS. 17 to 21 can be selectively formed by either rotating blade made of diamond or tungsten or laser without cooling process.

In addition, although the present embodiments describe cutting an attached panel of thin film transistor substrate and color filter substrate, the object is not limited only to the attached panel. In other words, all kinds of substrates having low toughness, for example, brittle silicon wafer can be also cut by the laser cutter of the present invention.

As described previously, the laser cutter according to the embodiment 1 of the present invention substantially prevents the object from being cut erroneously deviating from the marked cutting line by forming a pre-cut groove at the start edge and the end edge of the cutting line before irradiating the laser beam along the cutting line.

Also, in case that cutting lines are normal to each other, the laser cutter of the present invention can be used by forming a pre-cut groove at the starting edge of the second cutting line.

In addition, exact control of irradiation timing of laser beam and the position of pre-cut grooves by the position sensor prevents waste of electric power and coolant.

Moreover, since it is possible to grind the upper edge of the cut face using laser beam, the static electricity can be prevented during the grinding step.

In addition, it is possible to round the upper edge of the cut face without an additional grinding step using an elliptic laser beam with a longer axis that is parallel to the cutting line.

Figure 22:
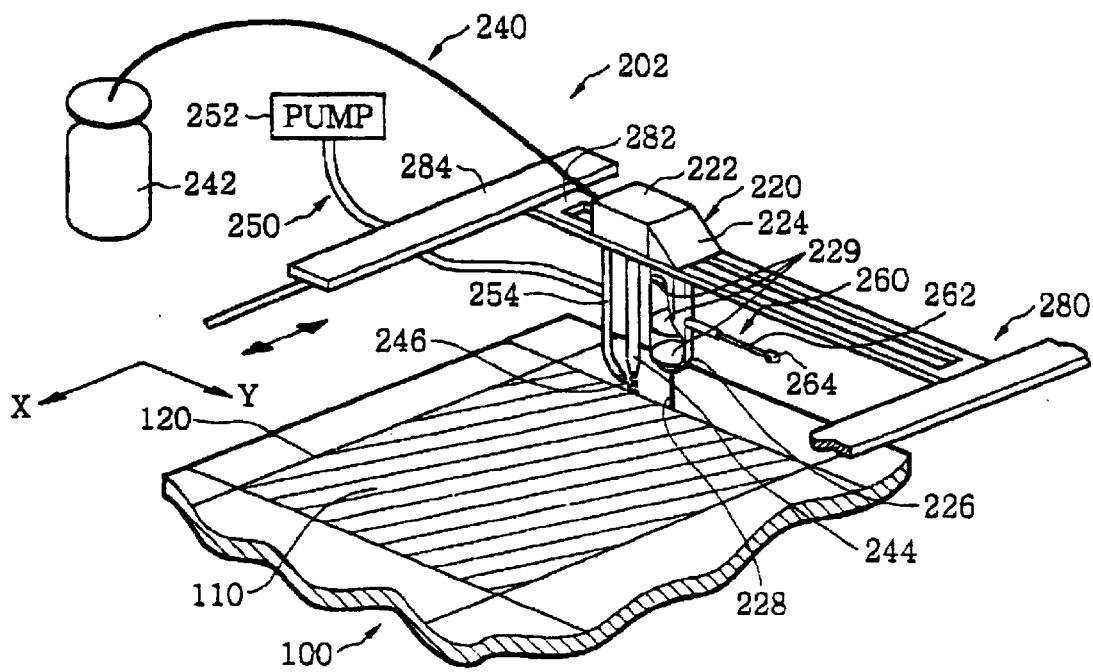
FIG. 22 is a perspective view of a laser cutter in accordance with further still another embodiment of the present invention.

FIG. 22 is a perspective view of a laser cutter 202 according to a second embodiment of the present invention, in which the laser cutter 202 has not only advantages and features of the laser cutter provided in the first embodiment but prevents the deterioration of cutting capability and avoids surface contamination of an object being cut due to the dispersed coolant.

Referring to FIG. 22, a laser cutter 202 includes a coolant inhaler 250 for inhaling a coolant sprayed from a cooling unit 240, the cooling unit 240 used for the cooling the glass substrate heated by a laser unit 220 along a cutting line.

Here, since constitutions and operations of moving unit 280, laser unit 220, cooling unit 240, and pre-scriber 260 are almost the same as those of the first embodiment, such descriptions are not repeated.

The coolant inhaler 250 includes an inhaling pipe 254 disposed at the back of a coolant spraying unit 244 with respect to the traveling direction of the laser unit 220 along Y-axis moving plate 282, and a pump 252. The inhaling pipe 254 inhales coolant sprayed onto the cutting line 120 and the pump 252 vacuums the inhaling pipe 254.

Preferably, one end of the inhaling pipe 254 is bent toward the coolant spraying unit 244 such that the inhaling pipe 254 effectively inhales the sprayed coolant.

Here, the inhaling power of the pump 252 should be lower than the spraying pressure of the coolant 246, in order to prevent the coolant inhaling pipe 252 from inhaling coolant before it reaches the cutting line headed by the laser beam.

A method of cutting the glass substrate using the laser cutter 202 of FIG. 22 is described with reference to the accompanying drawings FIGS. 23A to 23C.

Figure 23A:
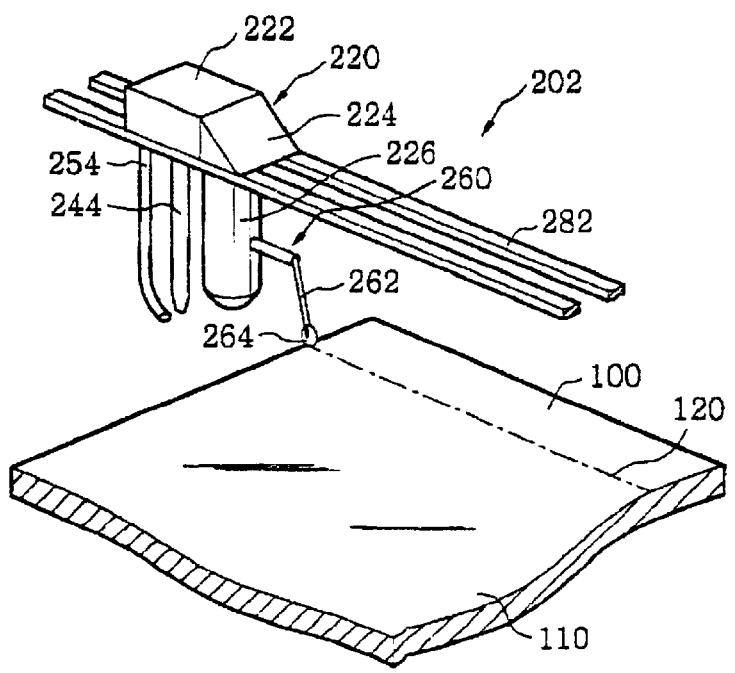
FIGS. 23A to 23C are schematic views describing a cutting manner with the laser cutter of FIG. 22.

First, referring to FIG. 23A, a glass substrate 100 of LCD panels is mounted on a plate (not shown). The substrate 100 has a scriber line 120 marked on the outer surface for the cutting. The laser cutter 202 moves toward the glass substrate 100 such that the rotating blade 264 of the pre-scriber 260 and focusing lens group housing 226 of the laser unit 220 are aligned with the scriber line 120.

As the pre-scriber 260 reaches the start edge of the scriber line 120 of the substrate 100, the rotating axis 262 of the pre-scriber 260 moves clockwise such that the rotating blade 264 is positioned at the cutting start edge of the cutting line 120 on the substrate 100. The rotating blade 264 rotates at a specific RPM, thereby forming a cutting start groove 30 shown in a circle of FIG. 23B at the start edge of the scriber line 120.

After forming the cutting start groove 30, the rotating blade 264 stops and the rotating axis 262 returns to the original position by moving counterclockwise.

Thereafter, laser beam is oscillated from the laser oscillation unit 222. The oscillated laser beam 228 is irradiated to a refraction lens 224 and is refracted by a selected degree. The refracted laser beam is focused by passing through the focusing lens group 229. At this time, diameter of the beam becomes a few μm.

The focused laser beam is irradiated onto the substrate 100 along the scriber line 120 starting from the cutting start groove by the laser unit 220 moving along the rail of the Y-axis moving plate 282.

At this time, the cutting line 120 is heated to a high temperature by the irradiation of the laser beam, resulting in a local heat-expansion with a high stress concentration. The nozzle 242 of the cooling unit 240 following the focusing lens housing 226 sprays coolant onto the heated cutting line 120 discretely by an interval of 0.1–0.3 seconds, so that the heated cutting line 120 is rapidly cooled. The coolant has very a low temperature compared with the heated cutting line 120.

By cooling the cutting line 120, the cutting line 120 is repeatedly heat-expanded and contracted and thereby high thermal stress is concentrated at the scriber line 120 of the substrate 100.

When the thermal stress becomes larger than the bonding force of the glass molecules, amorphous glass molecule bonding is broken and thereby a crack is generated along the scriber line 120.

The crack propagates along the irradiating direction of the laser beam, that is, perpendicularly to the surface of the substrate 100, cutting the substrate 100 completely.

Figure 23B:
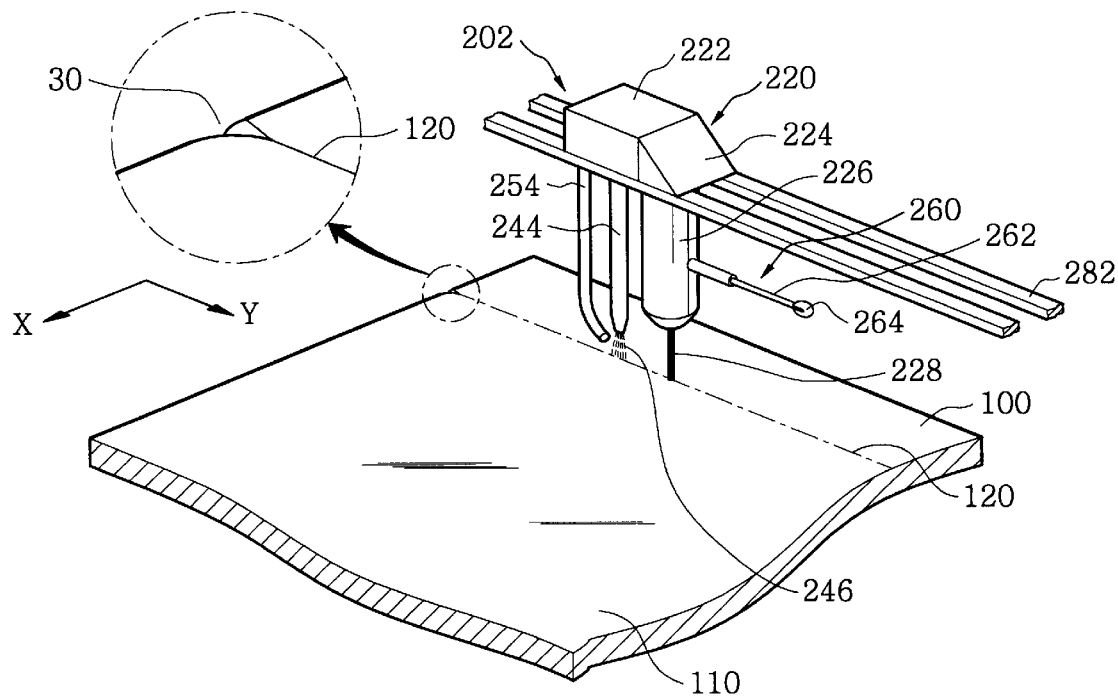

Referring to FIG. 23B, the coolant 298 if sprayed in a liquid state, may remain and dry up on the surface of the substrate 100, to contaminating the substrate 100.

In addition, the liquid coolant may vaporize by the temperature of the heated substrate 100, diffusing toward the focusing lens housing 229. The diffused coolant scatters the irradiating laser beam. Meanwhile, the gas coolant may also be vitalized by the heated cutting line 120 to diffuse into the focusing lens housing 229, thereby scattering the laser beam. Accordingly, in order to prevent the laser beam scattering and the substrate contamination, the coolant inhaler 250 should inhale the coolant after cooling the heated substrate. In other words, as soon as the coolant 246 contacts the scriber line 120 for cooling down, the pump 252 operates to vacuum the coolant inhaling pipe 254. The coolant inhaling pipe 254 inhales the coolant 246 by the pressure difference from the outside atmosphere. For example, when pure water is used as the coolant 246, the coolant inhaling pipe 254 in vacuum state inhales the pure water 246 remaining on the surface of the substrate 100 and the stream vaporized by the high temperature of the heated scriber line 120. And, when nitrogen gas is used as the coolant 246, the coolant inhaling pipe 254 inhales the nitrogen gas before the nitrogen gas impinged on the scriber line 120 is diffused.

At this time, since vacuum pressure of the pump 252 is lower than spraying pressure of the coolant 246, the coolant can be prevented from directly sucked into the coolant inhaling pipe 254 before contacting the scriber line 120.

Figure 23C:
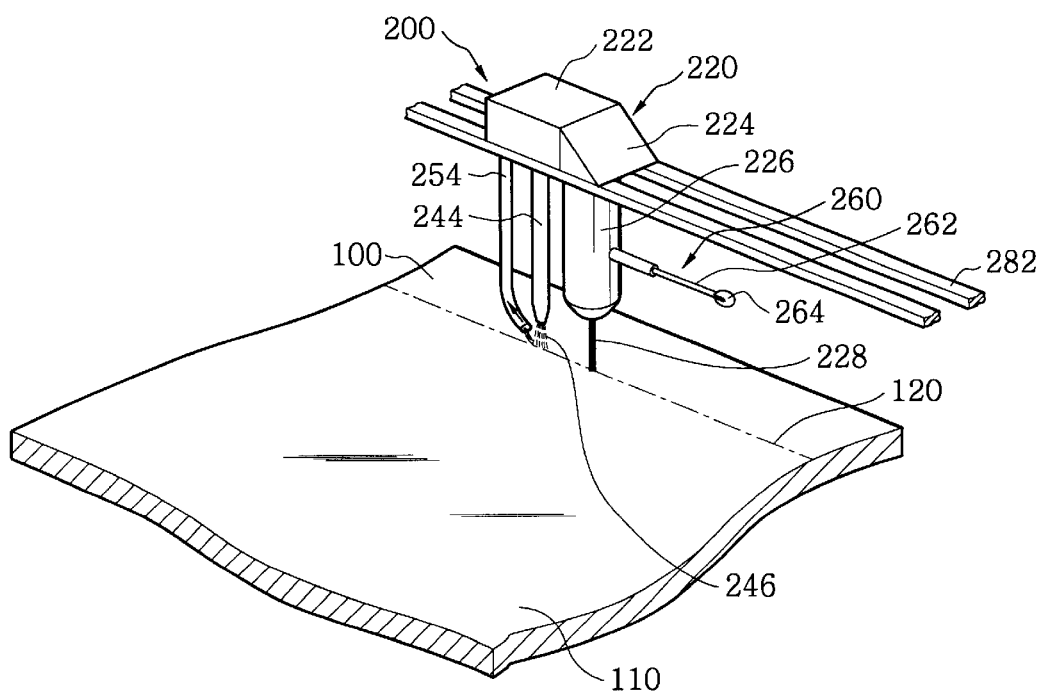

Next, referring to FIG. 23C, as the laser unit 220 continues to move along the Y-axis moving plate 282 cutting the substrate 100, the sprayed coolant 246 is inhaled by the coolant inhaler 250. As the prescriber 260 reaches the end edge of the scriber line 120, the rotating axis 262 rotates toward the substrate 100 and forms a cutting end groove at the end edge of the scriber line 120.

After cutting through one side glass of the substrate, the substrate is flipped over and the other side glass of the substrate is then cut in the same manner.

Thus, according to the second embodiment of the present invention, the coolant inhaler is disposed at the back of the cooling unit and inhales the coolant after cooling of the heated scriber line of the substrate, thereby preventing the scattering of the laser beam to improve the cutting power.

In addition, the laser cutter according to the second embodiment of the present invention prevents the contamination of the substrate and also prevents the liquid crystal inlet hole from being plugged up due to the remaining coolant.

Meanwhile, although the second embodiment shows and describes that the laser cutter including the laser unit, prescriber, cooling unit, and coolant inhaler moves along the scriber line, it is possible that the cutting process is performed by moving the substrate with the laser cutter fixed.

In the cooling unit applied to the laser cutters of the first and second embodiments, when the temperature of coolant gas around the scribe line 120 is lower than that of coolant gas on the scribe line 120, a crack does not propagate along the marked cutting line but deviates from a marked cutting line.

In order to prevent this kind of cutting failure, the diameter of the nozzle spraying the coolant should be very small, preferably the same size as that of the laser beam.

Figure 26:
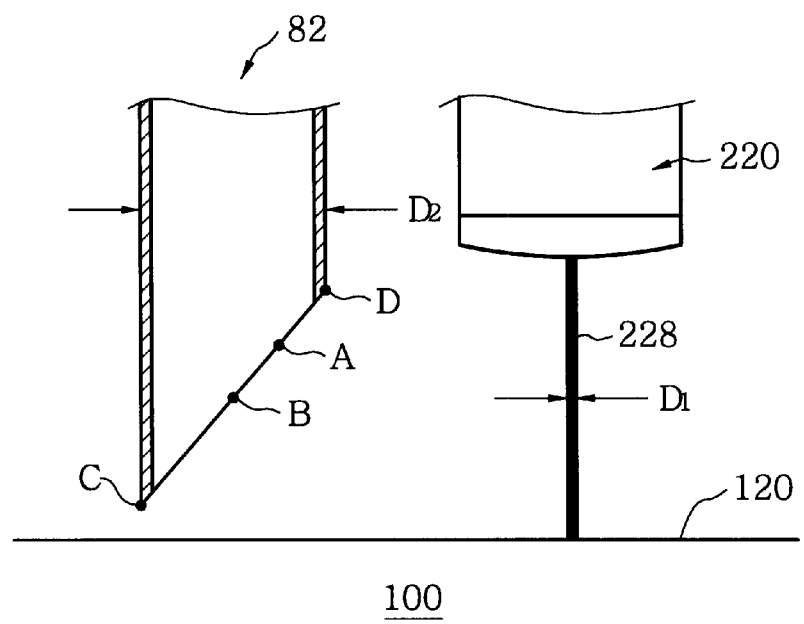
FIGS. 26 and 27 are schematic views for describing variation of a cutting manner according to a structural modification of the spraying nozzle of the cooling unit.

As shown in FIG. 26, however, when comparing the diameter D1 of the laser beam 22 passing the scribe line 120 with the diameter D2 of the nozzle 82, the diameter D2 is much larger than the diameter D1 (D1<D2).

Therefore, a third embodiment of the present invention provides a laser cutter having a cooling unit with an improved nozzle structure. Here, the nozzle has an oblique end like the end of a syringe. Since a laser unit, a pre-scriber, a coolant inhaler, and a moving plate of the third embodiment have the same constitutions and structures as those of the first and the second embodiments, their descriptions are not repeated.

Figure 24:
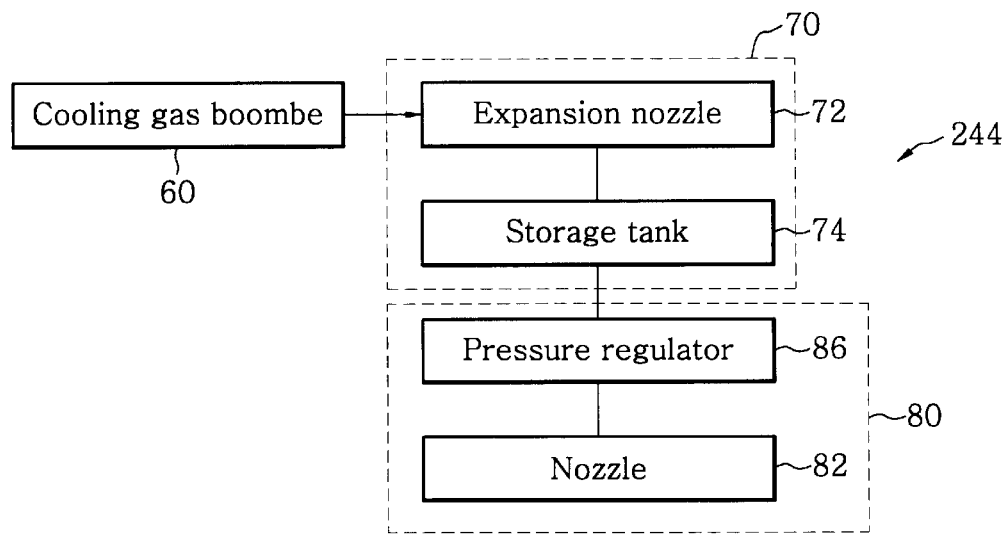
FIG. 24 is a block diagram of a cooling unit in the laser cutters in accordance with embodiments of the present invention.
Figure 25:
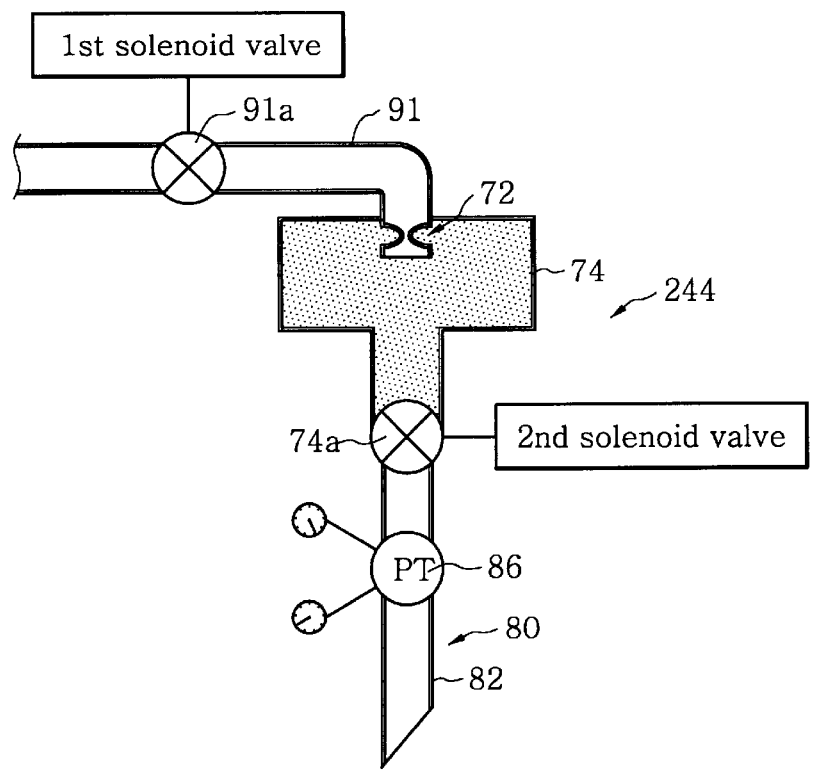
FIG. 25 is a partial constitutional view of the cooling unit of FIG. 24.

FIG. 24 is a block diagram of a cooling unit according to the third embodiment and FIG. 25 shows a simplified constitution of the cooling unit according to the third embodiment.

Referring to FIGS. 24 and 25, the cooling unit 244 includes a bombe 60 which stores liquidized inert gas such as liquid nitrogen, liquid helium, etc., acting as coolant for cooling the heated scribe line, a phase transforming unit 70 transforming liquid coolant stored in the bombe 60 into vaporized coolant, and a spraying unit spraying the vaporized coolant of the low temperature.

As shown in FIG. 25, the phase-transforming unit 70 includes an expansion nozzle 72 disposed at one end of a coolant supplying pipe 91, and a storage tank 74 temporarily storing the low temperature nitrogen or helium gas vaporized by passing through the expansion nozzle 72.

The expansion nozzle 72 has a structure of which diameter abruptly decreases and then abruptly increases along the supplying direction of the coolant such that the liquid inert gas supplied through the coolant supplying pipe 91 is easily vaporized.

To control the liquid coolant supplied from the coolant supplying pipe 91, a first solenoid valve 91a is installed in a selected position of the coolant supplying pipe 91. The first solenoid valve 91a is controlled by a control unit (not shown) such as a microprocessor.

A second solenoid valve 74a is disposed at the outlet of a storage tank 74. The second solenoid valve 74a is coupled to a microprocessor and controls supplying amount of the vaporized coolant stored in the storage tank 74. The spraying nozzle 82 is coupled to the second solenoid valve 74a. In order to prevent the substrate from being broken due to the impinge by the coolant of high pressure, a pressure control unit 86 for controlling the coolant pressure is selectively disposed in the middle of the spraying nozzle 82.

Operation of the cooling unit having the above constitution is described with reference to the accompanying drawings FIGS. 24 to 26.

As soon as the laser beam 228 is irradiated onto the scribe line 120, the first solenoid valve 91a disposed at one end of the coolant supplying pipe 91 opens gradually and the liquid coolant in the bombe 60 is supplied through the coolant supplying pipe 91.

Afterwards, volume of the liquid coolant is abruptly expanded by passing through the expansion nozzle 72, and the expanded coolant is then stored in the storage tank 74 in a vaporized state.

Thereafter, as the second solenoid valve 94a opens, the coolant is sprayed from the spraying nozzle 82. At this time, the pressure of the sprayed coolant is controlled by the pressure control unit 86. Since the temperature of the substrate contacting the coolant varies according to the pressure of the sprayed coolant, the pressure of the coolant should be controlled within a proper range.

Figure 27:
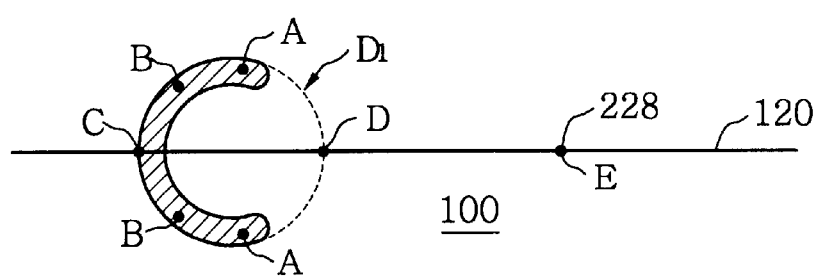

FIGS. 26 and 27 are simplified views for describing the distribution of the coolant in relation to the scribe line 120, in which reference numeral 82 is the spraying nozzle and reference numeral 220 is the laser unit.

Referring to FIGS. 26 and 27, the temperature distribution of the coolant varies depending on the distance between the scribe line 120 and the oblique end of the spraying nozzle 82. That is, as shown in FIG. 26, the coolant temperature is the lowest at portion C which is nearest to the scribe line 120 and the temperature at portions B and A is much higher than that of portion C. Accordingly, the spraying nozzle 82 is placed to position the portion C at the most backwards of the moving direction of the laser unit 220 along the scribe line 120.

Thus, according to the third embodiment of the present invention, the oblique end of the spraying nozzle whose nearest portion C to the surface of the substrate moves along the scribe line, prevents the cutting failure deviating from the scribe line.

Despite the addition and modification of various units provided in the embodiments 1 to 3, it is very difficult to confirm moving path of the irradiated laser beam by a viewer's eye, unlike the cutter using diamond blade.

Therefore, a fourth embodiment provides a laser cutter capable of visibly confirming moving path of the irradiated laser beam.

Figure 28:
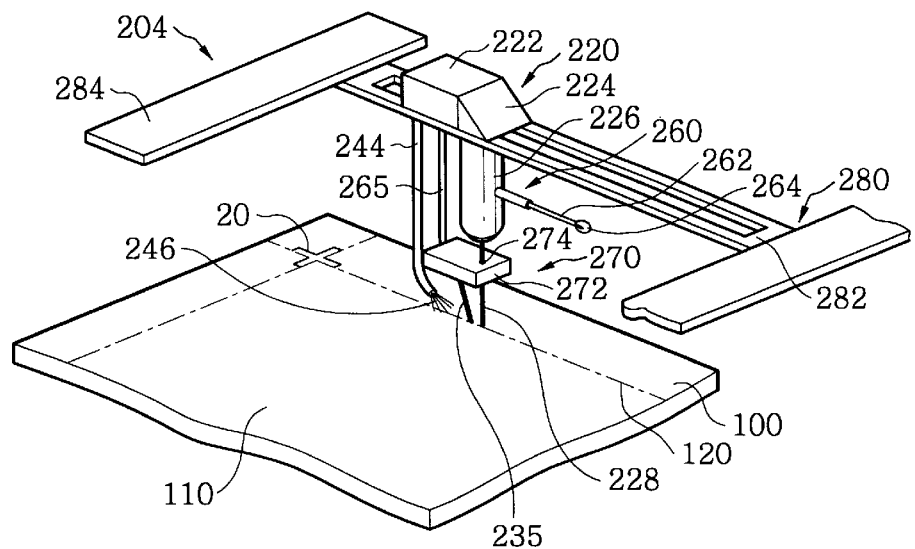
FIG. 28 is a perspective view of a laser cutter in accordance with still another embodiment of the present invention.
Figure 29:
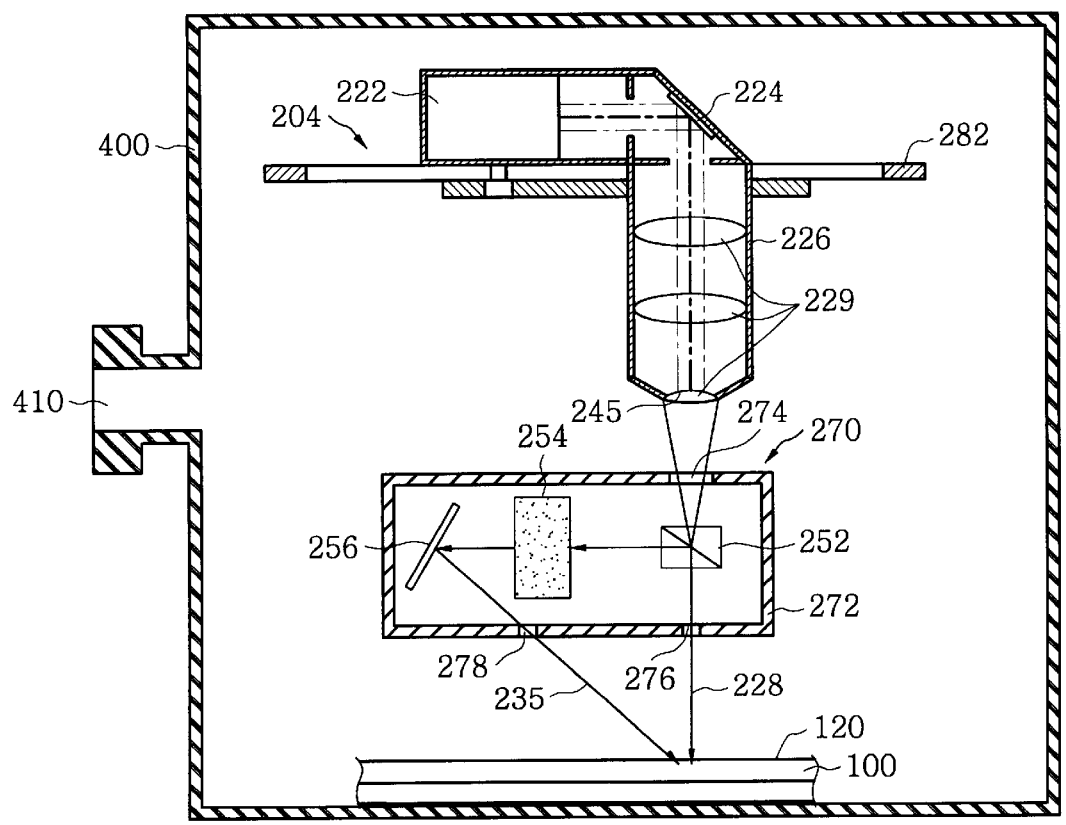
FIG. 29 is a detail view of FIG. 28.

FIG. 28 is a perspective view of a laser cutter in accordance with the fourth embodiment of the present invention and FIG. 29 shows a detailed constitution of the laser cutter provided in FIG. 28.

Referring to FIG. 28, a laser cutter 204 includes a light modulation unit 270 for modulating a laser beam into a visible ray 235 such that a viewer can observe a traveling path of a laser beam for cutting a substrate.

The light modulation unit 270 is fixed to a Y-axis moving plate by a supporting member 265. Here, since a moving unit 280, a cooling unit 240, and pre-scriber 260 have the same constitutions as those of the embodiments 1 and 2, their descriptions are not repeated.

Referring to FIG. 29, the laser cutter 204 including the light modulation unit 270 is established in a dark chamber to prevent a laser beam with high power from affecting an observer. In order to observe a moving path of the laser beam for the cutting, window 410 is established on a selected position of the wall of the chamber 400.

The light modulation unit 270 established below a focusing lens housing 226 for irradiating the laser beam, includes a housing 272, a beam splitter 252 for splitting the incident laser beam into two laser beams by passing through a part of the incident laser beam and reflecting the remainder of the incident laser beam, a light modulation part 254 for modulating the laser beam divided by the reflection from the beam splitter 252, and a reflective mirror 256 for reflecting the modulated laser beam at a selected degree.

The laser beam oscillated through a laser oscillating unit 22 and then irradiated from a beam outlet 245 of the focusing lens housing 226 is an infrared ray having oscillating wavelength of 1,300 nm and power of 50–250 watts.

Either YAG laser or $CO_2$ laser is used in order to obtain above specifications.

The beam splitter 252 disposed below the focusing lens housing 226 includes two prisms attached together each of which has an oblique face. A polarizing film is attached to each of the two oblique faces. The beam splitter 252 passes through a part of the incident laser beam 274 and reflects the remainder.

The light modulation part 254 is disposed in parallel with the beam splitter 252 at the back of the beam splitter 252 with respect to the moving direction of the laser unit 220, and modulates the laser beam having the infrared ray wavelength of approximate 1,300 nm into an indicative laser beam of the visible ray band having wavelength of approximate 630 nm, which is visible to human eye.

Preferably, as the light modulation part 254, nonlinear material such as crystal, polymer, or liquid crystal is used.

The reflective mirror 256 which is established at the back of the light modulation part 254 with a selected decline, reflects the indicative laser beam 235 outputted from the light modulation part 254 to the back of the cutting laser beam 228. Here, the cutting laser beam 228 and indicative laser beam 235 both are positioned along the scribe line 120.

Meanwhile, the housing 272 containing the beam splitter 252, light modulation part 254, and reflective mirror 256 also has a cutting beam inlet 274 into which the cutting laser beam 228 is incident, a first laser beam outlet 276 for outputting the cutting laser beam passing through the beam splitter 252 onto the scribe line 120, and a second laser beam outlet 278 for outputting the indicative laser beam reflected by the reflective mirror 256 onto the scribe line 120. Here, it is preferable that the diameter of the cutting beam inlet 274 is larger by some small degree than that of the beam outlet 245 of the focusing lens housing 226.

The first laser beam outlet 276 is formed at a corresponding portion of the cutting beam inlet 274 of the housing 260 and the second laser beam outlet 278 is formed at the back of the first laser beam outlet 276, at a corresponding portion of the reflecting path of the indicative laser beam 235.

A method of cutting two glasses-attached substrate using the laser cutter 204 according to the embodiment 4 is described with reference to the accompanying drawings FIGS. 28 to 29.

First, referring to FIG. 28, the laser cutter 222 moves toward the glass substrate 100 such that the rotating blade 264 of the pre-scriber 260, and the cutting beam inlet 274, the first beam outlet 276, and the second beam outlet 278 which are disposed at the housing of the light modulation unit 270 are aligned with the scriber line 120. Here, the scribe line 120 is defined by the cutting key 20. The light modulation unit 270 can be easily aligned with the scribe line 120 by aligning the indicative laser beam 235 with the scribe line 120.

As the alignment of the rotating blade 264 of the pre-scriber 260, and the first and second beam outlets 276 and 278 with the scribe line 120 is completed, the rotating axis 262 of the pre-scriber 260 moves clockwise such that the rotating blade 264 is positioned at the cutting start edge of the scribe line 120 of the substrate 100. The rotating blade 264 rotates at a specific RPM, to form a cutting start groove at the start edge of the scriber line 120.

After forming of the cutting start groove, the rotating blade 264 stops and the rotating axis 262 returns to the original position by moving counterclockwise.

Thereafter, laser beam is oscillated from the laser oscillation unit 222. The oscillated laser beam 228 is irradiated to a refraction lens 224 and is then refracted by a selected degree. The refracted laser beam is focused by passing through the focusing lens group 229. At this time, diameter of the beam becomes a few $\mu m$. The focused laser beam is irradiated form the beam outlet 245 of the focusing lens housing 226.

The output laser beam from the beam outlet 245 of the focusing lens housing 226 is introduced into the beam splitter passing through the cutting beam inlet 274 formed in the housing 272 of the light modulation unit 270. Here, a part of the light introduced into the light modulation unit 270 passes through the first beam outlet 276 and the remainder passes through the second beam outlet 278 of the light modulation unit 270. In detail, 50% of the incident laser beam introduced into the beam splitter 252 of the light modulation unit 270 passes through the beam splitter 252 and is irradiated onto the scribe line 120 of the substrate passing through the first laser beam outlet 276, and the remainder 50% is 90 degree reflected by the beam splitter 252.

The beam reflected from the beam splitter 252 is incident into the light modulating part 254 parallel to the beam splitter 252. The light modulating part 254 modulates the incident beam into a visible ray with a wavelength band which is visible to human eye. For example, the incident beam with wavelength of 1,300 nm is modulated into the visible ray of red color with wavelength of 600 by passing through the light modulating part 254. Thus, the modulated beam 235(or indicative laser beam) is reflected by the reflective mirror 256 and is then irradiated onto the scribe line 120 passing through the second laser beam outlet 278. The indicative laser beam 235 follows the cutting laser beam 228 along the scribe line 120. Therefore, observer can view the moving path of the cutting laser beam 228 from the moving path of the indicative laser beam 235.

Thus, the cutting laser beam 228 outputted from the first laser beam outlet 276 heats the scribe line 120 to generate crack and the indicative laser beam 235 outputted from the second laser beam outlet 278 by following the cutting laser beam 228 shows the observer the moving path of the cutting laser beam 228.

Meanwhile, the substrate 100 rapidly heated by the irradiation of the cutting laser beam is rapidly cooled down by coolant sprayed from the spraying nozzle 244.

At this time, the scribe line 120 is locally heat-expanded and contracted by the rapid heating and cooling and thereby high thermal stress is concentrated on the scribe line 120.

When the thermal stress becomes larger than the bonding force of the glass molecules, amorphous glass molecule bonding is broken and thereby crack is generated along the scriber line 120 to cut the substrate 100.

During these cutting steps, an observer determines whether the cutting laser beam deviates from the marked scribe line 120 from the indicative laser beam 235. When the moving path of the indicative laser beam deviates from the marked scribe line 120, the observer determines that the cutting laser beam deviates from the marked scribe line 120 and stops the laser cutter 204. Then, the laser cutter 204 is aligned again such that the cutting laser beam 228 is irradiated along the scribe line 120. Cutting step along the remaining scribe line 120 continues to be performed.

Thus, according to the embodiment of the present invention, since an observer can observe the traveling path of the cutting laser beam 228 from the traveling path of the indicative laser beam 235, the cutting failure deviating from the marked scribe line can be prevented.

Meanwhile, although the embodiment shows and describes that the laser cutter including the laser unit, pre-scriber, cooling unit, and light modulation unit moves along the scriber line, it is possible that the cutting process is performed by moving the glass substrate with the laser cutter fixed.

As previously described, the fourth embodiment makes it possible to observe the moving path of the cutting laser beam by an observer's eye. However, since the laser cutter relies only on the observer's eye to find a cutting failure, it is difficult to precisely compare the marked scribe line with the moving path of the cutting laser beam, and a minor mismatch can be missed. Sometimes, the minor mismatch between the moving path of the cutting laser beam and the marked scribe line may cause massive failures. For example, when the cutting laser beam deviates from the marked scribe line toward the cell area, crack is also propagated towards the cell area. These cut cells are determined to fail. This kind of cutting failure does not stop at one attached panel but induces cutting failures of at least from a few tens of panels to maximum a few hundreds. Accordingly, the fifth embodiment provides a laser cutter capable of stopping the cutting step or correcting the moving path of the cutting laser beam deviated form the marked scribe line.

Figure 30:
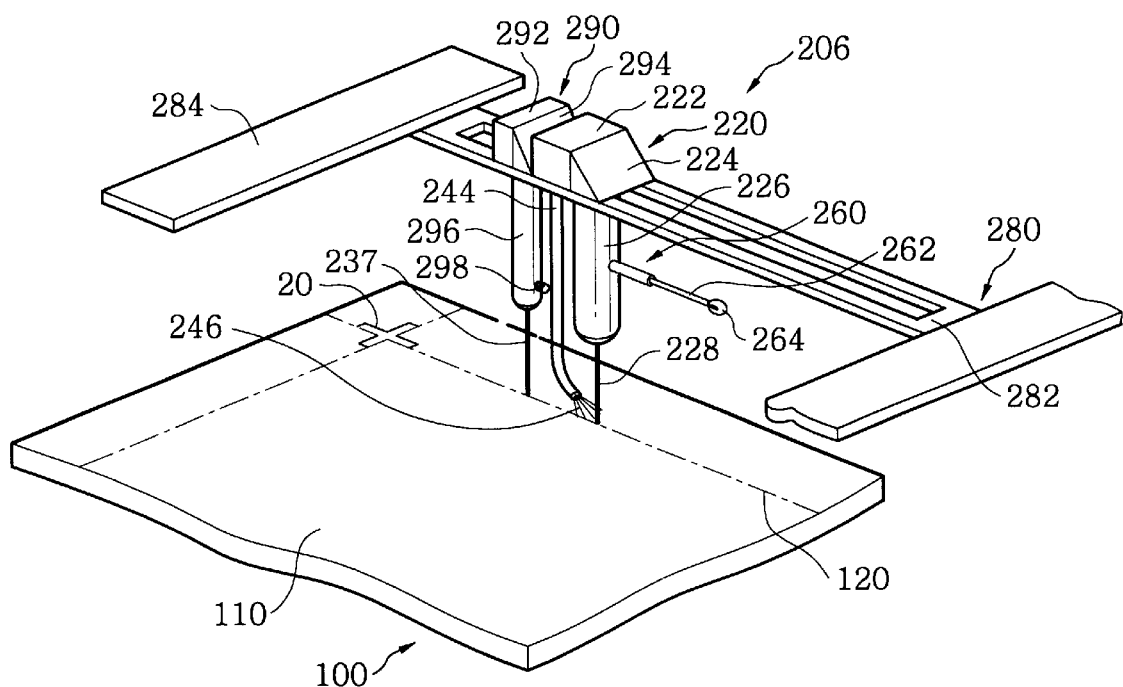
FIG. 30 is a perspective view of a laser cutter in accordance with still another embodiment of the present invention.

FIG. 30 is a perspective view of a laser cutter 206 according to the embodiment 5.

Referring to FIG. 30, the laser cutter 206 includes a first laser unit 220 for irradiating a laser beam for the cutting, a cooling unit 240 for spraying coolant onto the scribe line heated by the irradiation of the cutting laser beam, and a second laser unit 290 for tracing progressive path of crack propagated along the scribe line 120. Here, the cooling unit 240 is disposed at the back of the moving direction of the first laser unit 220 and the second laser unit 290 is disposed at the back of the moving direction of the cooling unit 240.

Meanwhile, a prescriber 260 for forming a cutting start groove at the start edge of the scribe line 120 and a moving unit 280 are selectively established, and the coolant inhaler provided in the embodiment 2 can be selectively established. Since their constitutions and functions are the same as those of the embodiments 1 to 4, their descriptions are not repeated.

Like the fourth embodiment, the laser cutter 206 is established within a dark chamber, and a window is disposed on the wall of the chamber such that the moving path of the cutting laser beam 228 is visible to an observer.

Like the first laser unit 220, the second laser unit 290 includes a laser oscillating unit 292, a refraction lens 294, a focusing lens group(not shown), and a focusing lens housing 296. At a selected portion of the wall of the focusing lens housing 296 is established a light sensor 298. The light sensor 298 senses a beam reflected from crack which is generated along the scribe line 120. Preferably, the light sensor 298 is a sensor detecting light amount reflected from the crack generated along the scribe line of the substrate 100.

Figure 31:
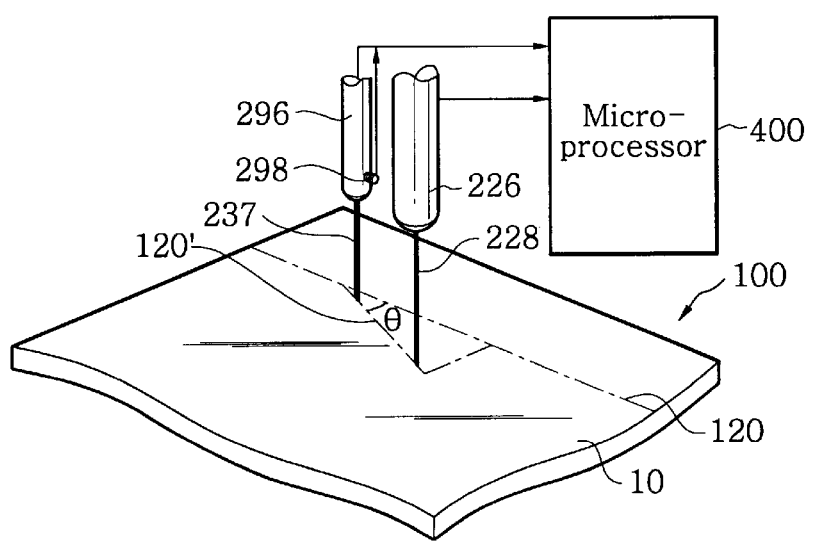
FIG. 31 is a schematic view for describing a manner of correcting the moving path of the laser cutter of FIG. 30.

As shown in FIG. 31, the sensor 298 and the first and second laser 220 and 290 are connected to a controller 400 such as a microprocessor. The microprocessor 400 compares pre-stored path of the marked scribe line 120 with a path of a real cutting line 120' from light amount sensed by the light sensor 298 and thereby controls to stop the operation of the laser cutter 206 or to correct traveling path of the moving plate 280.

The second oscillating unit 292 of the second laser unit 290 is disposed at the Y-axis moving plate 282 and oscillates a second laser beam 237(or crack detecting laser beam) for detecting the crack generated in the real cutting line 120'. For instance, the second laser beam for the detection of the crack is a visible ray having an oscillation wavelength of approximate 630 nm, and the moving path thereof is visible to observer. At this time, a helium-neon laser is used for the second laser unit 290.

Preferably, as the first laser unit 220, either YAG laser or $CO_2$ laser is used. At this time, the cutting laser beam 228 which is oscillated from the laser oscillating unit 222 of the first laser 220 and then irradiated below the focusing lens housing 226, is an infrared ray having an oscillation wavelength of 1,300 nm and high power of 50–250 watts.

A method of cutting the glass substrate using the laser cutter 206 according to the embodiment 5 is described with reference to the accompanying drawings FIGS. 30 to 32.

First, referring to FIG. 30, the laser cutter 206 moves toward the glass substrate 100 such that the rotating blade 264 of the pre-scriber 260, the cutting laser beam 228, and the crack detecting laser beam 237 are aligned with the scriber line 120 defined by the cutting key 20. As the alignment of the rotating blade 264 of the pre-scriber 260, and the cutting laser beam 228, and the crack detecting laser beam 237 with the scribe line 120 is completed, the rotating axis 262 of the pre-scriber 260 is moves clockwise such that the rotating blade 264 is positioned at the cutting start edge of the scribe line 120 of the substrate 100. The rotating blade 264 rotates at a specific RPM, thereby forming a cutting start groove at the start edge of the scriber line 120.

After forming the cutting start groove, the rotating blade 264 stops and the rotating axis 262 returns to the original position by moving counterclockwise.

Thereafter, the cutting laser beam 228 focused at a few $\mu$m and then irradiated from the focusing lens housing 226 rapidly heats the substrate 100 along the scribe line 120, starting from the cutting start groove formed at the start edge of the scribe line 120 of the substrate 100.

Meanwhile, the substrate 100 rapidly heated by the irradiation of the cutting laser beam 228 of the first laser 220 is rapidly cooled down by coolant sprayed from the spraying nozzle 244. By cooling the heated scribe line 120, crack is generated along the scribe line 120 of the substrate 100 (ST500).

Meanwhile, the crack detecting laser beam 237 focused at a few $\mu$m by the focusing lens group of the second laser 290 and then irradiated from the focusing lens group housing 296 is irradiated onto the crack generated, following the coolant sprayed along the scribe line 120.

When the crack detecting laser beam 237 is irradiated onto the crack, a part of the crack detecting laser beam 237 is reflected by the crack. At this time, the sensor disposed on the wall of the focusing lens housing 296 of the second laser 290 detects an amount of the light reflected from the crack, transforms the detected light amount signal into a corresponding electric signal, and transfers the transformed electric signal to the microprocessor 400.

Next, the microprocessor 400 perceives a propagation path 120' of the crack generated from the input electric signal and compares the propagation path 120' of the crack with the pre-stored path of the marked scribe line 120. By comparison of two paths, it is determined whether the propagation path 120' of the generated crack deviates from the marked scribe line 120(ST510).

When the propagation path 120' of the crack corresponds with the path of the marked scribe line, the cutting step is continued.

However, when the propagation path 120' of the crack does not correspond with the path of the marked scribe line, the microprocessor 400 determines that the propagation path 120' of the crack deviates from the path 120 of the marked scribe line and measures a deviating angel θ between the propagation path 120' of the crack and the path 120 of the marked scribe line (ST520). Afterwards, the microprocessor 400 controls the position of the X-axis moving plate 284 such that the propagation path 120' of the crack corresponds with the path of the marked scribe line 120(ST 530).

As the alignment of the X-axis moving plate 284 is completed, the first laser 220 again irradiates the cutting laser beam 228 along the marked scribe line 120 and the second laser 290 following the first laser 220 irradiates the crack detecting laser beam 237 onto the crack generated to detect the propagation path of the crack 120.

The microprocessor 400 determines again whether the propagation path 120' corresponds with the path of the marked scribe line 120(ST 540). From the determination, if two paths correspond each other, the cutting step continues to be performed(ST 550). If two paths do not correspond, it returns to the step(ST 520) for measuring the deviating angle θ.

Thus, according to the fifth embodiment, since the propagation path of the crack corresponds automatically with the path of the marked scribe line 120, a cutting failure deviating from the marked scribe line 120 is substantially prevented. In addition, since the cutting failure is limited to one attached panel and the same cutting failure in the following panels can be avoided by correcting the cutting path, mass failures can be prevented. Moreover, the lower cutting failure rate extends, the operation time of the apparatus, resulting in an improvement of through-put.

Meanwhile, although the fifth embodiment shows and describes that the laser cutter including the first and second laser units, prescriber, cooling unit, etc., moves along the scriber line, it is possible that the cutting process is performed by moving the glass substrate with the laser cutter fixed.

Respective laser cutters provided in the first through the fifth embodiments are effectively applied to the fabrication of a tiled LCD panel for accomplishing a very large panel size.

Figure 32:
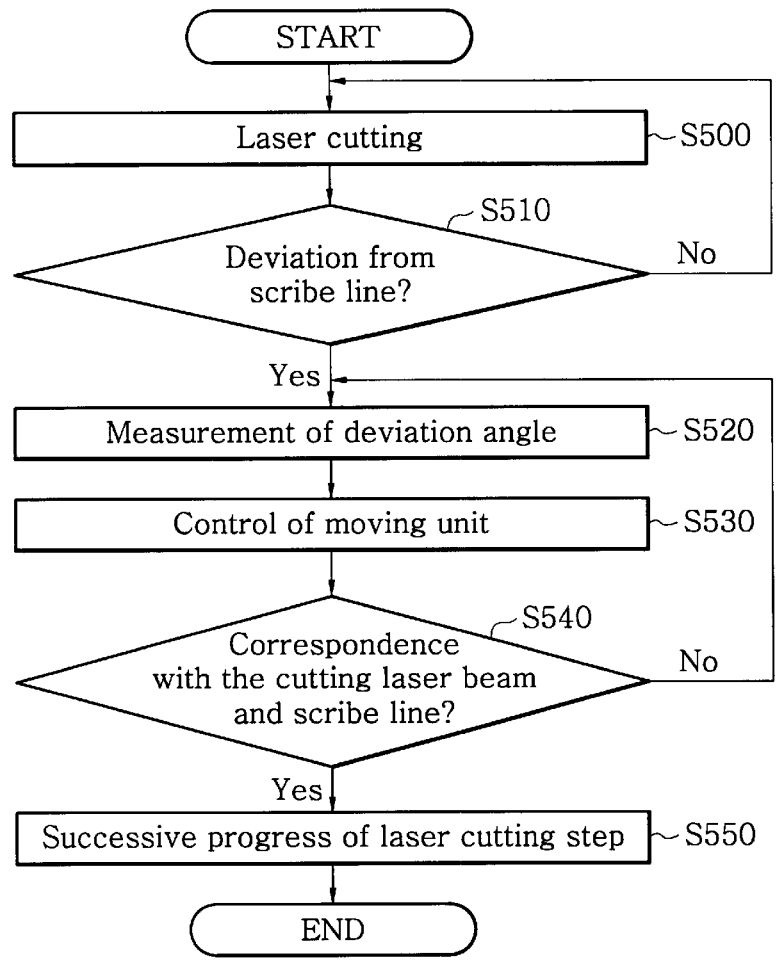
FIG. 32 is a flow chart for describing a manner of correcting the traveling path of the laser cutter of FIG. 30.
Figure 33:
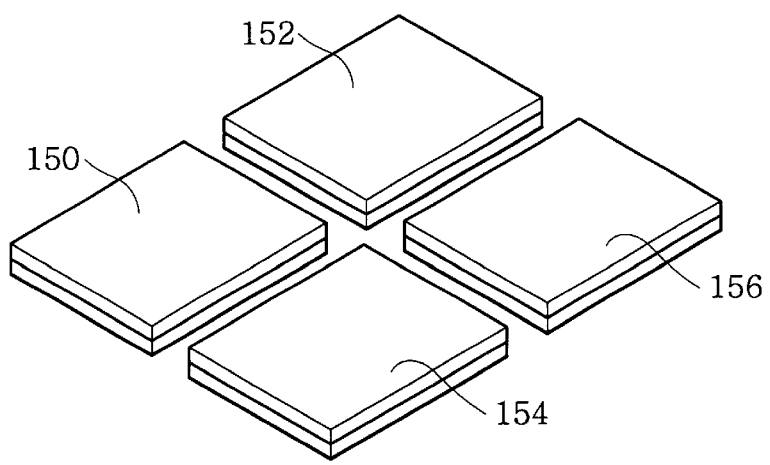
FIGS. 33 to 37 are schematic views showing a process of fabricating a tiled liquid crystal display using the laser cutter in accordance with embodiments of the present invention.
Figure 34:
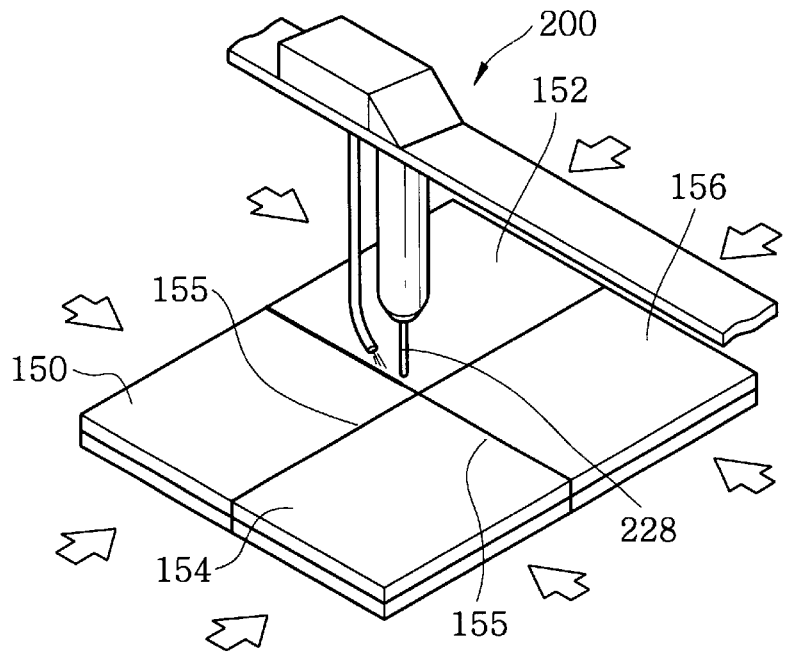

FIG. 32 shows a fabrication method of a tiled LCD panel using unit panels cut by a laser cutter provided in the present invention.

For the fabrication of a flat panel display with high resolution and large panel size, it is first required that multiple unit panels with high resolution of XGA or UXGA be fabricated and the fabricated panels be smoothly and finely cut.

For these requirements, one of laser cutters 200, 202, 204, 206 provided in the first through the fifth embodiments is selectively used.

Multiple unit LCD panels 150, 152, 154, 156 are prepared by a laser cutting method which includes irradiating laser beam onto a scribe line of a mother glass and rapidly cooling the scribe line heated by the irradiation of the laser beam.

During the laser cutting, a method forming the cutting start groove and cutting end groove at the start edge and end edge of the scribe line is selectively used. In case that a cross point where the scribe lines cross each other exist in the mother glass, a pre-cut groove shown in FIGS. 19 and 20 is necessarily formed.

In addition, so as to prevent occurrence of irregular crack when fine crack starting from the outer surface of the mother glass propagated toward the inner surface of the mother glass, a two-step cutting method provided in FIG. 12 is also selectively used.

Through selective applications of the above cutting methods, multiple unit LCD panels having finely and smoothly cut faces are prepared. For example, four unit LCD panels are made into one large flat panel display. In other words, four sheets of 30 inch unit LCD panels 150, 152, 154, 156 are aligned to 2×2 square matrix, resulting in one 60 inch panel. Selectively, in case that two sheets of LCD panels are aligned to 1×2 matrix, two tiled LCD having 30 inch size is fabricated.

At the cut faces of the four unit LCD panels are formed edge electrodes connected to gate bus lines and data bus lines. One ends of the gate bus lines and data bus lines are exposed outside the unit LCD panels. When the unit LCD panels 150, 152, 154, 156 are aligned along a junction line 155, a laser 200 irradiates laser beam 228 along the junction line 155. Here, intensity of the laser beam 228 is controlled such that edges of the unit LCD panel participating in the junction is melted. The edge of the unit LCD panels 150, 152, 154, 156 are attached to each other.

Selectively, the four unit LCD panels are attached to each other by an additional intermediate. In this case, the additional intermediate should be made very thin such that a picture on the display is not divided by width of the seam line.

Figure 35:
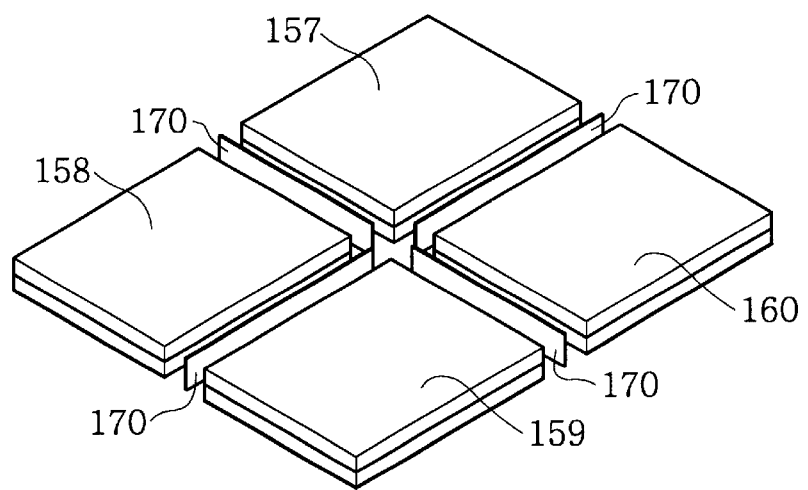
Figure 36:
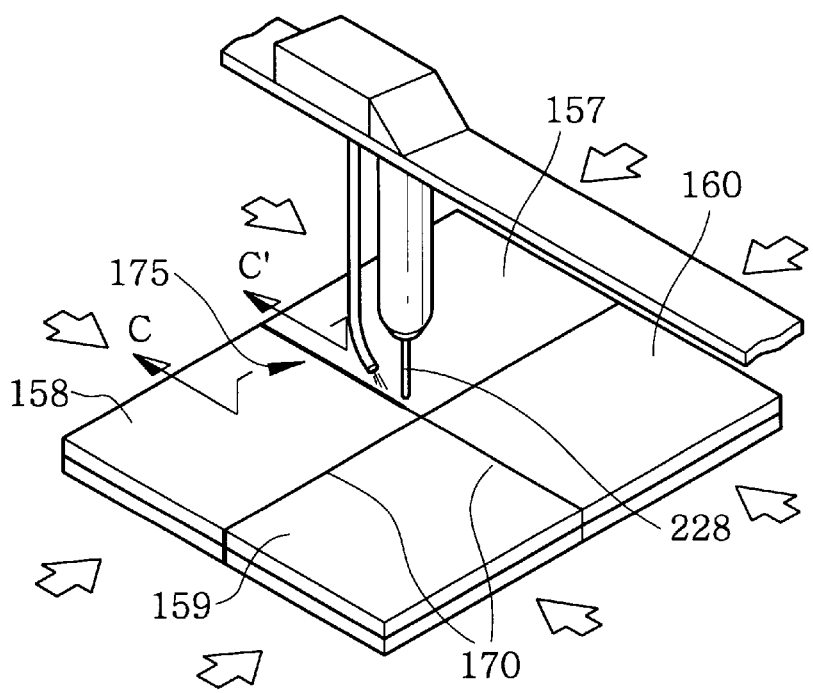

For instance, as shown in FIGS. 35 and 36, sintered glass or lead-contained glass can be used between unit LCD panels 157, 158, 159, 160 as an intermediate 170. The sintered glass and the lead-contained glass have a melting point remarkably lower than the glass used as substrate of the unit LCD panels.

As shown in FIG. 35, four intermediates 170 are respectively placed between the unit LCD panels 157, 158, 159, 160. Along the junction lines of the unit LCD panels, laser beam 228 is irradiated to melt the intermediates 170 as shown in FIG. 36. The melted intermediates 170 is cooled by coolant sprayed from a spraying nozzle and simultaneously the four unit LCD panels are attached to each other.

Here, since it is possible to make the sintered glass or lead-contained glass very thin, the width of seam line where adjacent unit LCD panels is attached to the intermediate can be made the same as the interval between pixels. Therefore, although the intermediate 170 is used, a large sized flat panel display with high resolution that does not show the seam line at the junction of the unit LCD panels can be fabricated.

Figure 37:
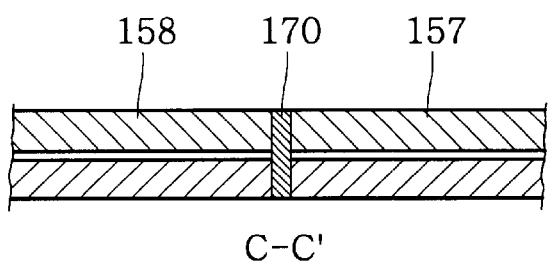

FIG. 37 is a section view taken along the line C–C' of FIG. 36 and shows that the intermediate is interposed between the adjacent two unit LCD panels 157 and 158.

The unit LCD panels attached to each other are made to be a large size flat panel display module through subsequent assembly steps.

As described previously, according to the sixth embodiment, since the cut faces by laser cutting are very fine and smooth, width of seam line is remarkably decreased and thereby large sized flat panel display with high resolution can be effectively fabricated. In addition, the fabrication method reduces the glass chips remarkably at the cut faces.

This invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A laser cutter, comprising:
    a laser unit for irradiating a laser beam with a specific wavelength along a cutting line of a target object being cut;
    means for forming a pre-cut groove at a selected portion of the cutting line;
    a cooling unit that supplies a coolant to the target object along the cutting line on which the laser beam has been irradiated; and
    a coolant inhaler for inhaling a coolant supplied to the target object,
    wherein said means for forming a pre-cut groove comprises:
        a first rod disposed in front of traveling direction of said laser unit;
        a second rod pivotally coupled to said first rod, said second rod rotating clockwise or counterclockwise; and
        a rotating blade coupled to one-sided end of said second rod, for forming a pre-cut groove at a selected portion of the cutting line of the object being cut.

2. A laser cutter as claimed in claim 1, further comprising means for moving said laser unit, said means for forming a pre-cut groove, and said cooling unit to a selected direction.

3. A laser cutter as claimed in claim 1, further comprising means for moving the target object being cut to a selected direction.

4. A laser cutter as claimed in claim 1, wherein the selected portion is at least one of start edge and end edge of the cutting line.

5. A laser cutter as claimed in claim 1, wherein the cutting line is at least two that are perpendicular to each other, and the selected portion is a cross point where the cutting lines cross each other.

6. A laser cutter as claimed in claim 5, wherein the pre-cut groove formed at the cross point has a selected length along the cutting lines from the cross point.

7. A laser cutter as claimed in claim 5, wherein the pre-cut groove formed at the cross point is a circular structure.

8. A laser cutter as claimed in claim 1, wherein the cutting line is at least two, consisting of a first cutting line and a second cutting line normal to the first cutting line, and the selected portion is a start edge of the second cutting line.

9. A laser cutter as claimed in claim 1, wherein the object being cut is a substrate of two glasses attached together.

10. A laser cutter as claimed in claim 9, wherein the two glasses are respectively a color filter substrate and a thin film transistor substrate, wherein the thin film transistor substrate comprises a thin film transistor formed on an inner surface thereof, data and gate bus lines, and a pixel electrode, and wherein the color filter substrate comprises a color filter formed on an inner surface thereof and a counter electrode formed on the color filter.

11. A laser cutter as claimed in claim 9, wherein the substrate of two glasses attached together has an area corresponding to at least two unit liquid crystal display panel size and a space formed between the two attached glasses.

12. A laser cutter as claimed in claim 11, wherein said cooling unit comprises:
    a coolant supply part for supplying a coolant; and
    a spray nozzle for spraying the coolant along the cutting line of the target object on which the laser beam has been irradiated.

13. A laser cutter as claimed in claim 12, wherein said spray nozzle has an oblique tip.

14. A laser cutter as claimed in claim 12, wherein said coolant inhaler comprises:
    an inhaling pipe disposed at the back of said cooling unit with respect to the traveling direction of said laser unit; and
    a pump for making the inhaling pipe in a vacuum state.

15. A laser cutter as claimed in claim 14, wherein pressure of said pump is lower than that of the coolant.

* * * * *